US012777934B2

(12) United States Patent
Yang et al.

(10) Patent No.: US 12,777,934 B2
(45) Date of Patent: Oct. 27, 2026

(54) THROUGH VIA WITH GUARD RING STRUCTURE

(71) Applicant: Taiwan Semiconductor Manufacturing Company, Ltd., Hsin-Chu (TW)

(72) Inventors: Chih Hsin Yang, Hsinchu County (TW); Yen Lian Lai, Hsinchu (TW); Dian-Hau Chen, Hsinchu (TW); Mao-Nan Wang, Kaohsiung City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 621 days.

(21) Appl. No.: 18/304,527

(22) Filed: Apr. 21, 2023

(65) Prior Publication Data

US 2024/0071956 A1 Feb. 29, 2024

Related U.S. Application Data

(60) Provisional application No. 63/385,065, filed on Nov. 28, 2022, provisional application No. 63/374,152, filed on Aug. 31, 2022.

(51) Int. Cl.
*H10W 42/00* (2026.01)
*H10D 84/01* (2026.01)
(Continued)

(52) U.S. Cl.
CPC ........ *H10W 42/00* (2026.01); *H10D 84/0149* (2025.01); *H10D 84/0158* (2025.01);
(Continued)

(58) Field of Classification Search
CPC . H10W 42/00; H10W 42/121; H10W 20/023; H10W 20/20; H10W 20/0245;
(Continued)

(56) References Cited

U.S. PATENT DOCUMENTS 7,224,060 B2 * 5/2007 Zhang .................. H10W 42/00 257/730
8,890,293 B2 11/2014 Lu et al.
(Continued)

FOREIGN PATENT DOCUMENTS

TW 202209562 A 3/2022
TW 202232660 A 8/2022

*Primary Examiner* — Dao H Nguyen
(74) *Attorney, Agent, or Firm* — HAYNES AND BOONE, LLP

(57) ABSTRACT

Semiconductor structures and methods for forming the same are provided. A method according to the present disclosure includes forming active regions on a substrate, forming an interconnect structure over the active regions, the interconnect structure including a plurality of dielectric layers and a guard ring disposed within the dielectric layers, etching an opening through the interconnect structure and at least a first portion of the active regions, the opening extending into the substrate, and forming a via structure within the opening. The via structure is surrounded by the guard ring when viewed along a direction perpendicular to a top surface of the substrate.

20 Claims, 22 Drawing Sheets

(51) Int. Cl.
*H10D 84/03* (2025.01)
*H10D 84/83* (2025.01)
*H10W 20/00* (2026.01)
*H10W 20/20* (2026.01)

(52) U.S. Cl.
CPC ......... *H10D 84/038* (2025.01); *H10D 84/834* (2025.01); *H10W 20/023* (2026.01); *H10W 20/20* (2026.01); *H10W 42/121* (2026.01)

(58) Field of Classification Search
CPC ........... H10W 20/212; H10W 20/2125; H10W 20/2134; H10D 84/0149; H10D 84/0158; H10D 84/038; H10D 84/834; H10D 84/0151
See application file for complete search history.

(56) References Cited

U.S. PATENT DOCUMENTS

| | | | | |
|---|---|---|---|---|
| 9,780,046 | B2 * | 10/2017 | Pan | H01L 23/564 |
| 10,243,040 | B1 * | 3/2019 | Park | H10D 64/01 |
| 10,263,066 | B2 * | 4/2019 | Hiroi | H10D 1/042 |
| 11,075,273 | B1 * | 7/2021 | Reznicek | H10D 30/6735 |
| 12,087,709 | B2 * | 9/2024 | Chang | H01L 23/481 |
| 2012/0112322 | A1 * | 5/2012 | Lin | H10W 20/023 257/E29.022 |
| 2012/0241981 | A1 * | 9/2012 | Hirano | H01L 25/0657 257/777 |
| 2013/0154048 | A1 * | 6/2013 | Lu | H10D 84/038 438/667 |
| 2021/0028129 | A1 * | 1/2021 | Hara | H01L 23/585 |
| 2021/0249365 | A1 * | 8/2021 | Liu | H01L 23/5225 |
| 2021/0375796 | A1 | 12/2021 | Liu | |
| 2022/0254739 | A1 | 8/2022 | Ku et al. | |
| 2023/0197523 | A1 * | 6/2023 | Hsu | H10D 84/0142 257/392 |

* cited by examiner

THROUGH VIA WITH GUARD RING STRUCTURE

PRIORITY DATA

This application claims the benefit of U.S. Provisional Application No. 63/374,152, filed Aug. 31, 2022, and U.S. Provisional Application No. 63/385,065, filed Nov. 28, 2022, which are hereby incorporated by reference in their entirety.

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

More recent attempts have focused on through vias, e.g., through-silicon or through-substrate vias (TSVs). TSVs have found applications in three-dimensional (3D) ICs for routing electrical signal from one side of a silicon substrate of an IC to the other side thereof. Generally, a TSV is formed by etching a vertical via opening through a substrate and filling the via opening with a conductive material, such as copper. Protective structures, such as guard rings, have been developed to protect TSVs from moisture attack during manufacturing processes. TSVs and guard rings generally include features only formed in a back-end-of-the-line (BEOL) process. Such BEOL-only TSVs may generate stress on surrounding structures and cause reliability problems, as well as poor plasma-induced damage (PID) protection. Thus, while existing TSV structures are generally adequate for their intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
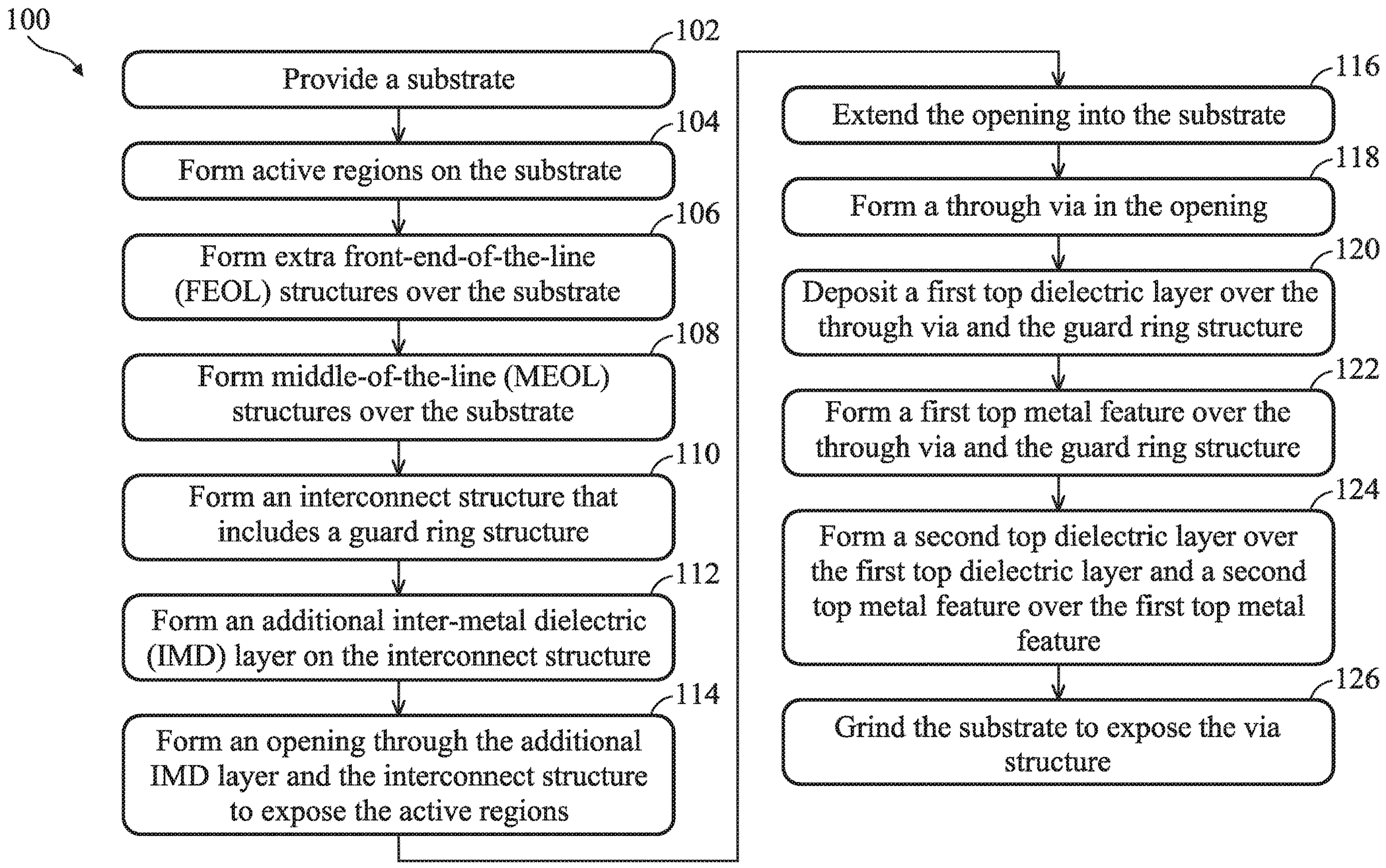
FIG. 1 is a flow chart illustrating an embodiment of a method of forming a device structure and a via structure through the device structure, according to various aspects of the present disclosure.

The present disclosure relates generally to integrated circuit devices, and more particularly, to interconnect structures for integrated circuit devices.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

An interconnect structure electrically couples various components (for example, transistors, resistors, capacitors, and/or inductors) fabricated on a substrate, such that the various components can operate as specified by design requirements. An interconnect structure includes a combination of dielectric layers and conductive layers configured to provide electrical signal routing. The conductive layers include via and contact features that provide vertical connections and conductive lines that provide horizontal connections. In some implementations, an interconnect structure may have multiple metal layers (or metallization layers) that are vertically interconnected by via or contact features. During operation of the IC device, the interconnect structure routes signals among the components of the IC device and/or distribute signals (for example, clock signals, voltage signals, and/or ground signals) to the components. An interconnect structure is formed in a back-end-of-the-line (BEOL) process, typically formed after the front-end-of-the-line (FEOL) process forms the active devices such as a transistor on a substrate and the middle-end-of-the-line (MEOL) process forms source/drain contact plugs and gate contact plugs.

In some implementations, there is a need to provide a vertical interconnect that extends through the interconnect structure and/or the substrate to facilitate various device structures, such as CMOS image sensors (CISs), a three-dimensional integrated circuit (3DIC), MEMS devices, radio frequency (RF) devices, wafer-on-wafer (WoW) devices, and so on. Such a vertical interconnect may be referred to as a through-silicon or through-substrate via (TSV) as it extends through, in whole or in part, the semiconductor substrate. The term TSV in the present disclosure broadly encompasses via structures that provide direct signal routing from a frontside of the substrate and a backside of the substrate or vice versa.

During the formation of TSVs, moisture may erode metal materials in regions accommodating TSVs. Guard rings have been developed as structural barriers surrounding TSVs to prevent moisture from attacking metal materials in these regions. Further, guard rings may also provide electrical barriers to protect nearby components from electrical interference from current carrying through TSVs.

TSVs and guard rings are generally formed in a BEOL process, separated from FEOL and MEOL processes. In other words, TSVs and guard rings may only include features formed in the BEOL process. Such TSVs and guard rings are referred to as BEOL-only structures. Distant from FEOL and MEOL features, BEOL-only TSVs and guard ring structures may generate stress on surrounding features, causing delamination and other failures. It has been found that BEOL-only TSVs and guard ring structures may cause unevenness after surface planarization on surrounding structures, potentially causing cracks and device off-target drifting. Further, it has been noticed that BEOL-only TSVs and guard ring structures have poor plasma-induced damage (PID) protection.

The present disclosure provides a TSV with a guard ring that include a combination of BEOL features and FEOL features (and MEOL features optionally in some embodiments). In some implementations, a TSV extends through active regions formed in an FEOL process, such as fin-like active regions, and is radially spaced apart from a guard ring surrounding the TSV. The direct contact between the TSV and the FEOL features reduces or absorbs the stress exerted by the TSV to surrounding structures. The guard ring may also land on the FEOL features and/or MEOL features (e.g., contact plugs) and is biased to ground to improve PID protection by providing a discharging path to ground. Such a guard ring is electrically isolated from the TSV. Alternatively, the guard ring may electrically connect to the TSV through some top metal features to better spread stress and reduce stray or parasitic capacitance between the TSV and the guard ring. In some implementations, corner stress relief (CSR) regions are provided inside or outside of the guard ring to further reduce stress as an effort to prevent cracking in corner regions of the TSV structure.

The various aspects of the present disclosure will now be described in more detail with reference to the figures. In that regard, FIG. 1 is a flowchart illustrating a method 100 of forming a device structure from a workpiece 200 (shown in FIGS. 2-20) and a via structure through the device structure, according to various aspects of the present disclosure. The method 100 is merely an example and is not intended to limit the present disclosure to what is explicitly illustrated in the method 100. Additional steps can be provided before, during and after the method 100, and some steps described can be replaced, eliminated, or moved around for additional embodiments of the method. Not all steps are described herein in detail for reasons of simplicity. The method 100 is described below in conjunction with FIGS. 2-20, which are fragmentary cross-sectional views and top views of the workpiece 200 at different stages of fabrication according to various embodiments of the method 100. Because the workpiece 200 will be fabricated into a device structure, the workpiece 200 may be referred to herein as a device structure 200 as the context requires. For avoidance of doubts, the X, Y and Z directions in FIGS. 2-20 are perpendicular to one another. Throughout the present disclosure, unless expressly otherwise described, like reference numerals denote like features.

The device structure 200 shown in the figures of the present disclosure is simplified and not all features in the device structure 200 are illustrated or described in detail. The device structure 200 shown in the figures may be a portion of an IC chip, a system on chip (SoC), or portion thereof, that may include various passive and active microelectronic devices such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof.

Figure 2:
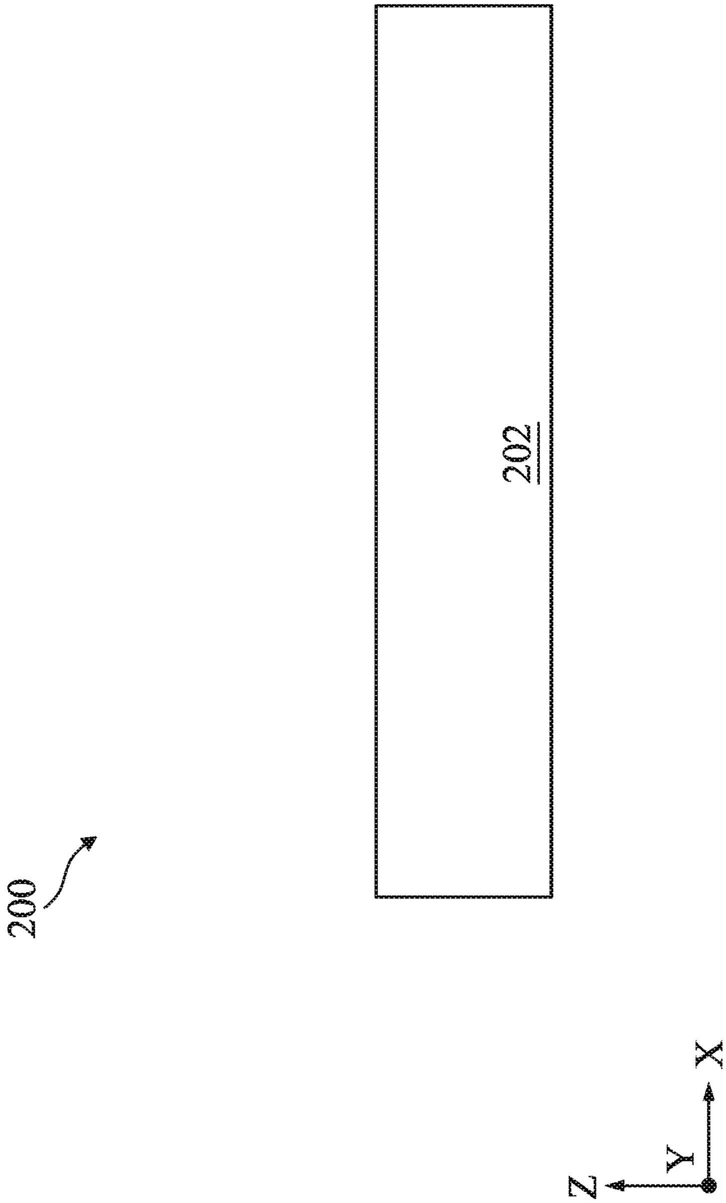
FIGS. 2, 3, 6, 7, 9, 10, 11, 12, 13, 14, 15, 16, 17, and 19 are fragmentary cross-sectional views of a workpiece undergoing operations of the method in FIG. 1, according to various aspects of the present disclosure.

Referring to FIGS. 1 and 2, the method 100 includes a block 102 where a substrate 202 is provided. The substrate 202 is a part of a workpiece 200, which will include further structures as the method 100 progresses. In an embodiment, the substrate 202 includes silicon (Si). Alternatively or additionally, the substrate 202 may include another elementary semiconductor, such as germanium (Ge); a compound semiconductor, such as silicon carbide (SiC), gallium arsenide (GaAs), gallium phosphide (GaP), indium phosphide (InP), indium arsenide (InAs), and/or indium antimonide; an alloy semiconductor, such as silicon germanium (SiGe), GaAsP, AlInAs, AlGaAs, GaInAs, GaInP, and/or GaInAsP; or combinations thereof. Alternatively, the substrate 202 may be a semiconductor-on-insulator substrate, such as a silicon-on-insulator (SOI) substrate, a silicon germanium-on-insulator (SGOI) substrate, or a germanium-on-insulator (GeOI) substrate. Semiconductor-on-insulator substrates can be fabricated using separation by implantation of oxygen (SIMOX), wafer bonding, and/or other suitable methods. The substrate 202 can include various doped regions (not shown) depending on design requirements of the device structure 200. In some implementations, the substrate 202 includes p-type doped regions (for example, p-type wells) doped with p-type dopants, such as boron (for example, $BF_2$), indium, other p-type dopant, or combinations thereof. In some implementations, the substrate 202 includes n-type doped regions (for example, n-type wells) doped with n-type dopants, such as phosphorus (P), arsenic (As), other n-type dopant, or combinations thereof. In some implementations, the substrate 202 includes doped regions formed with a combination of p-type dopants and n-type dopants. The various doped regions can be formed directly on and/or in the substrate 202, for example, providing a p-well structure, an n-well structure, a dual-well structure, a raised structure, or combinations thereof. An ion implantation process, a diffusion process, and/or other suitable doping process can be performed to form the various doped regions.

Figure 3:
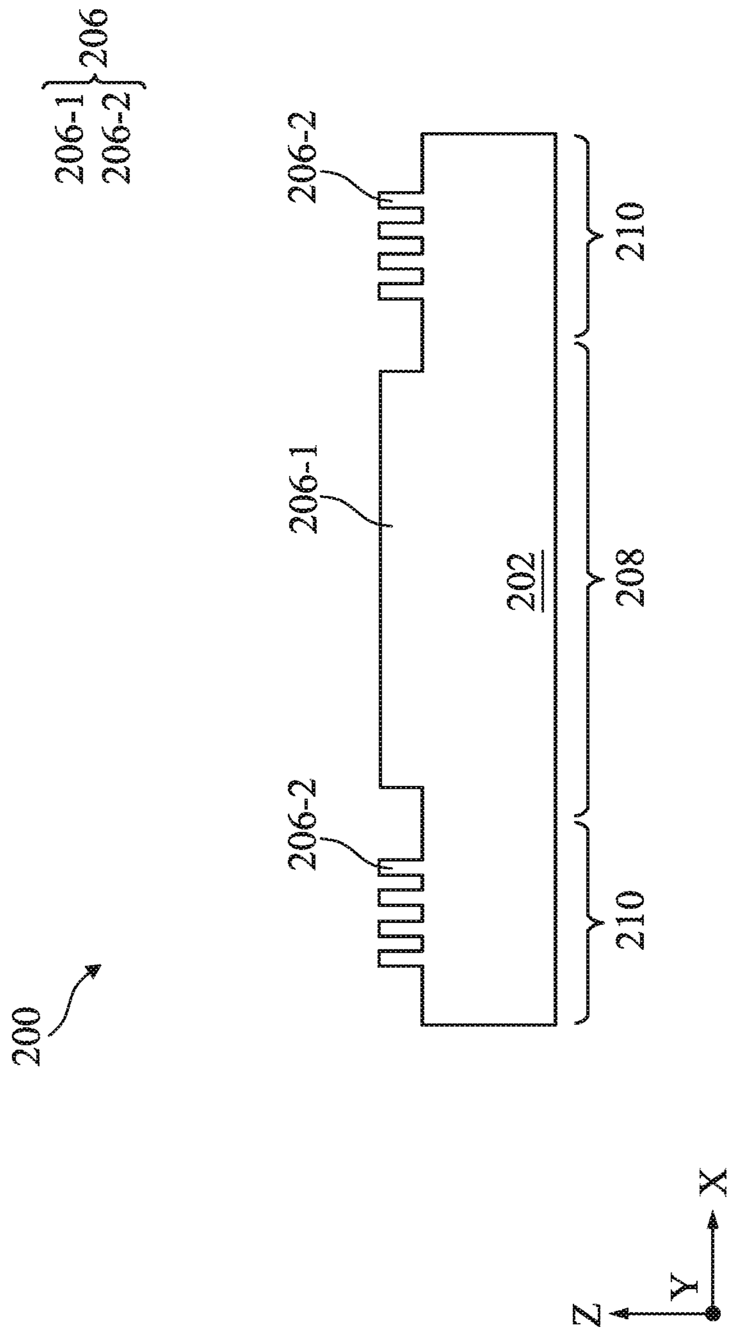
Figure 4:
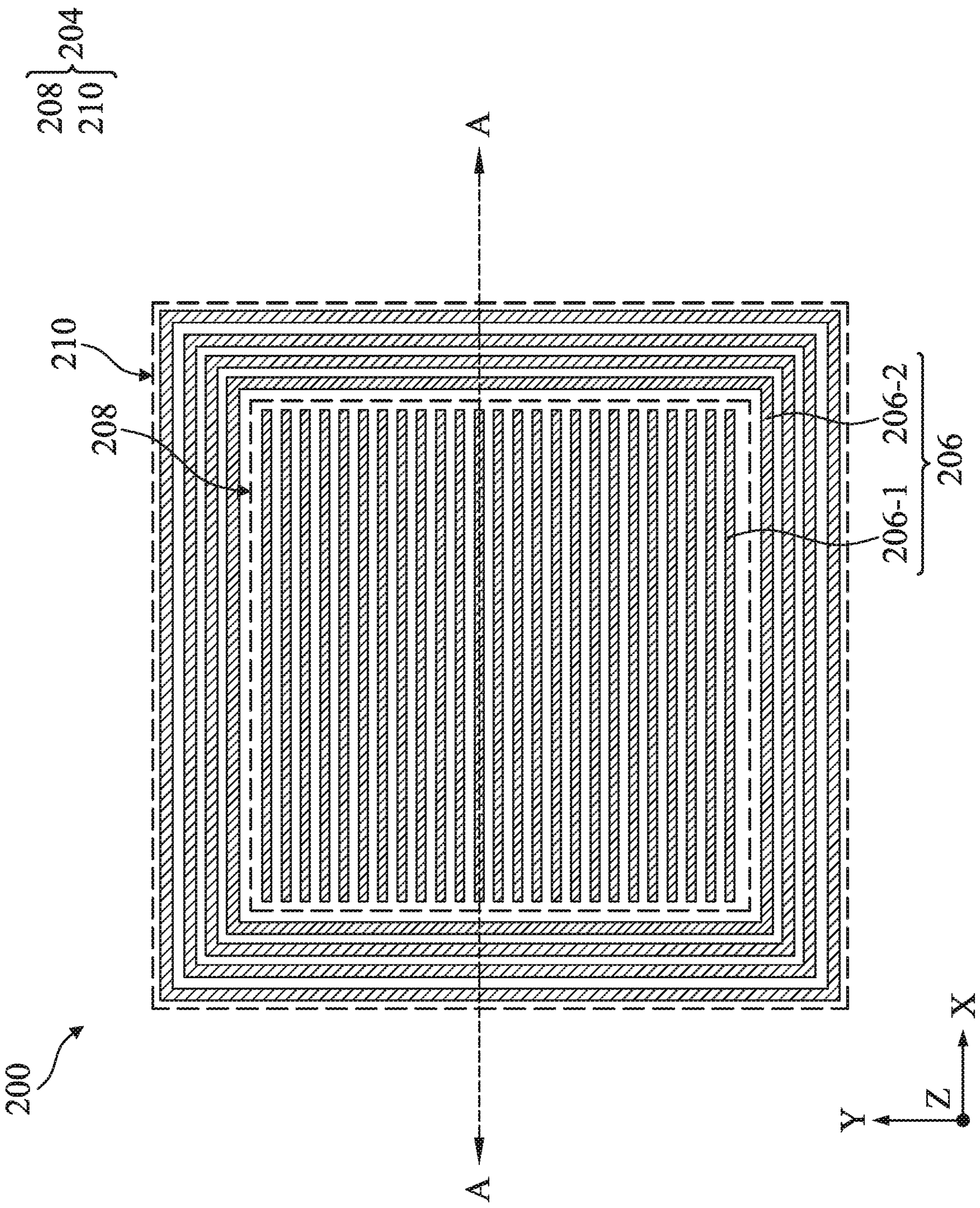
FIGS. 4, 5A, 5B, 5C, 5D, 8, 18A, 18B, 18C, 18D, and 20 are see-through top views of the workpiece undergoing operations of the method in FIG. 1, according to various aspects of the present disclosure.

Referring to FIG. 1 and FIGS. 3-4 collectively, the method 100 includes a block 104 where active regions are formed on the substrate 202 in an FEOL process. FIG. 3 is a fragmentary cross-sectional view of the workpiece 200 along a A-A cutline in FIG. 4, which is a top view of the workpiece 200. In the depicted embodiment, the active region is a fin-like active region that may be in the form of a first type of fins (denoted as fins 206-1) in a center region 208 or a second type of fins (denoted as fins 206-2) in a peripheral region 210 surrounding the center region 208. In the center region 208, the fins 206-1 extends lengthwise along the X direction. In the peripheral region 210, the fins 206-2 extend continuously in forming a moat-like (or ring-like) structure that fully surrounds the fins 206-1 in the top view. The fins 206-1 and fins 206-2 are collectively referred to as fins 206. As to be shown later on, a TSV is formed extending through the center region 208 and a guard ring is form above the peripheral region 210. Accordingly, the center region 208 is also referred to as a TSV region 208, and the peripheral region 210 is also referred to as a guard ring region 210.

The fins 206 may be formed by directly patterning a top portion of the substrate 202, such that the fins 206 protrude from the substrate 202 as a continuous crystalline semiconductor material (e.g., Si). The fins 206 may also be formed by epitaxially growing an epitaxial stack of first semiconductor layers (e.g., Si) and second semiconductor layers (e.g., SiGe) alternatively disposed one on another over the substrate 202 (not explicitly shown in FIG. 3) and then patterning to form the individual fins 206. The fins 206 may be patterned by any suitable method. For example, the fins 206 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins 206 by etching the initial epitaxial semiconductor layers. The etching process can include dry etching, wet etching, reactive ion etching (RIE), and/or other suitable processes. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant.

Figure 5A:
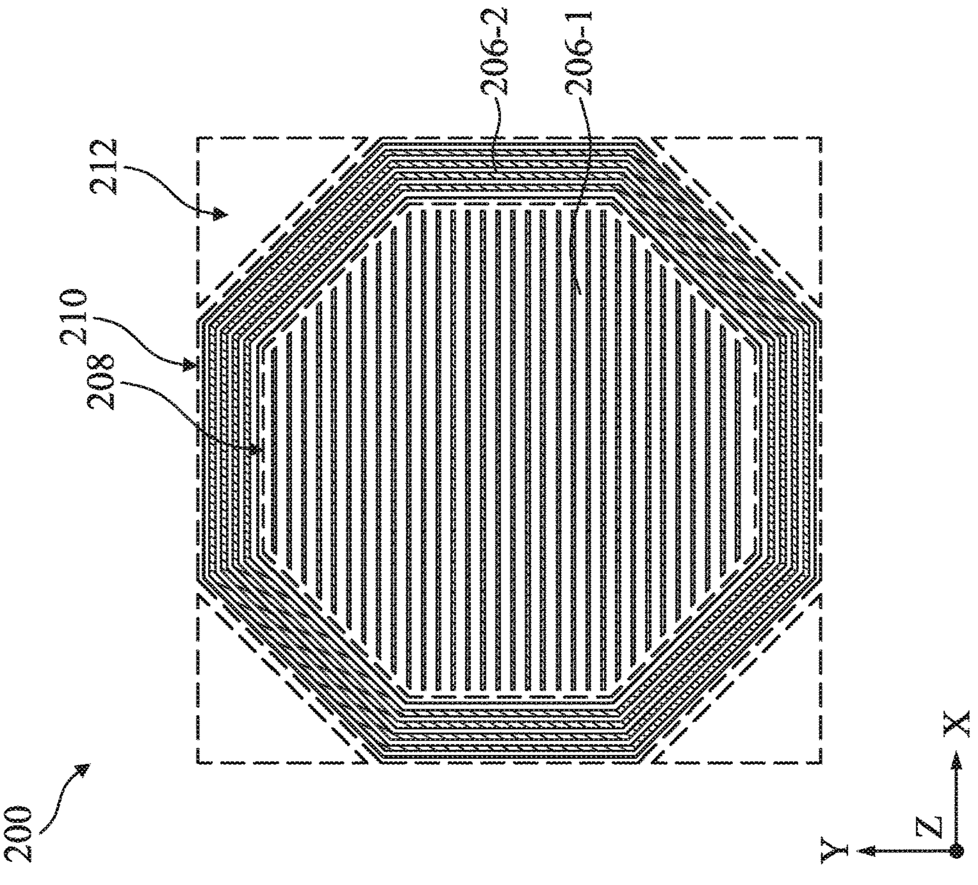
Figure 5B:
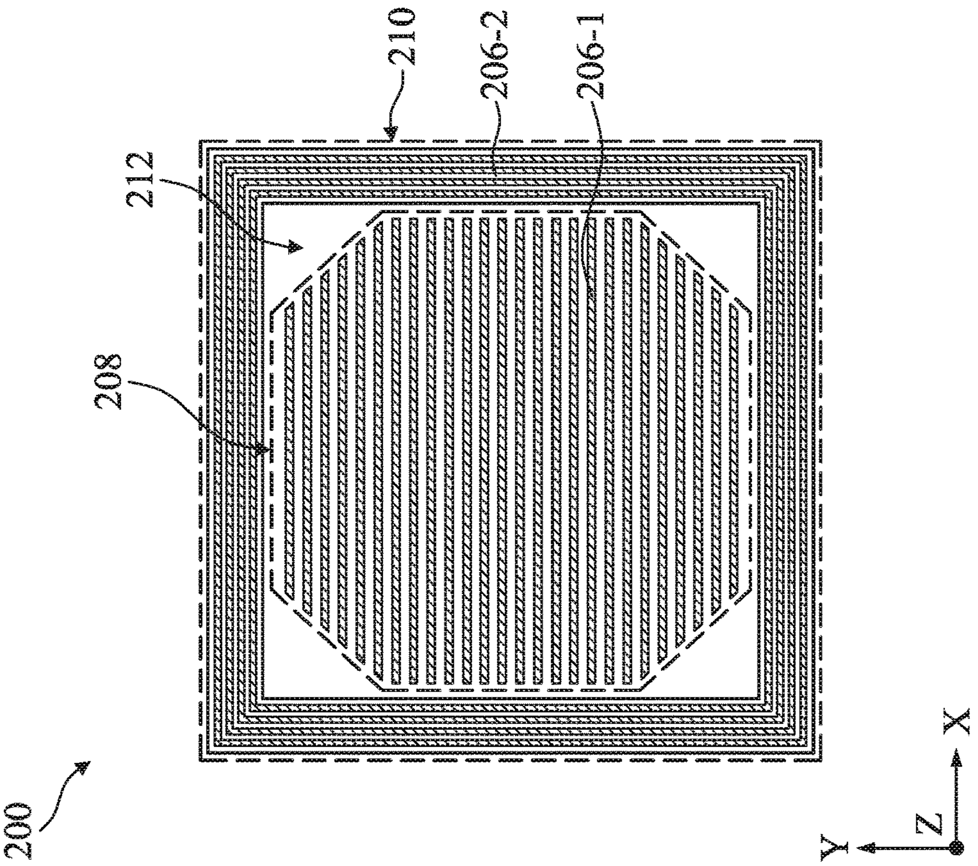
Figure 5C:
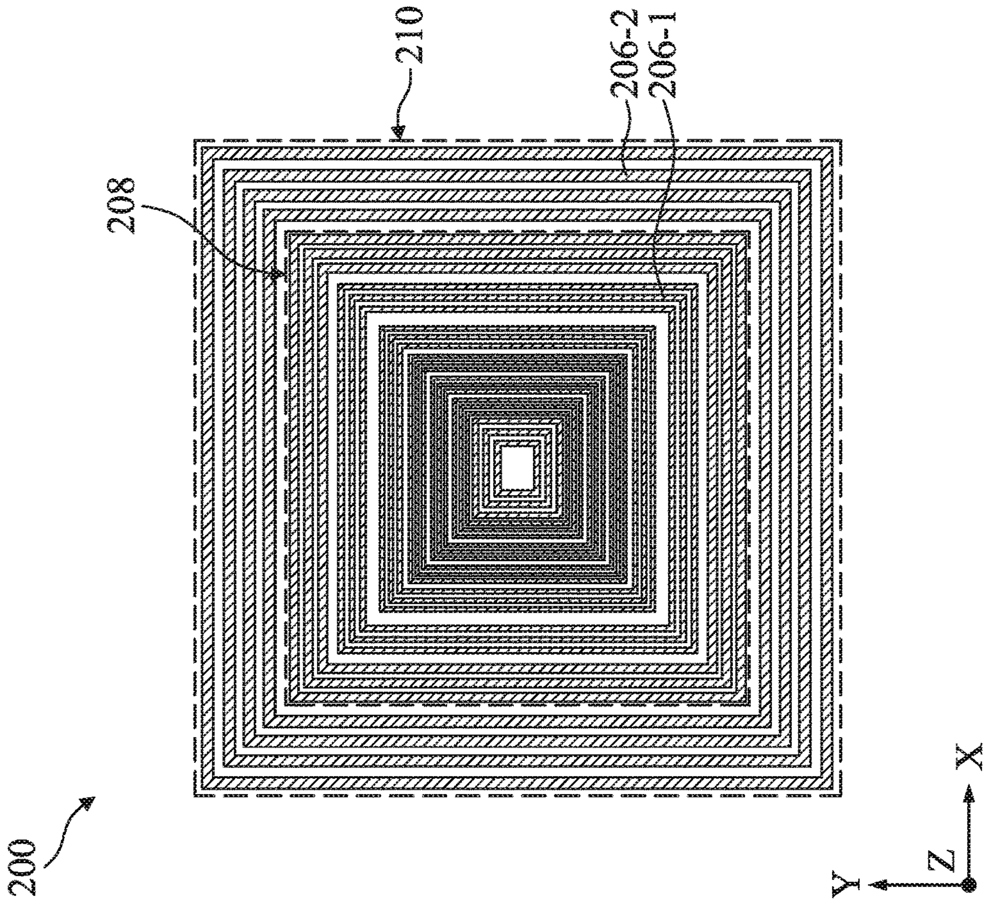
Figure 5D:
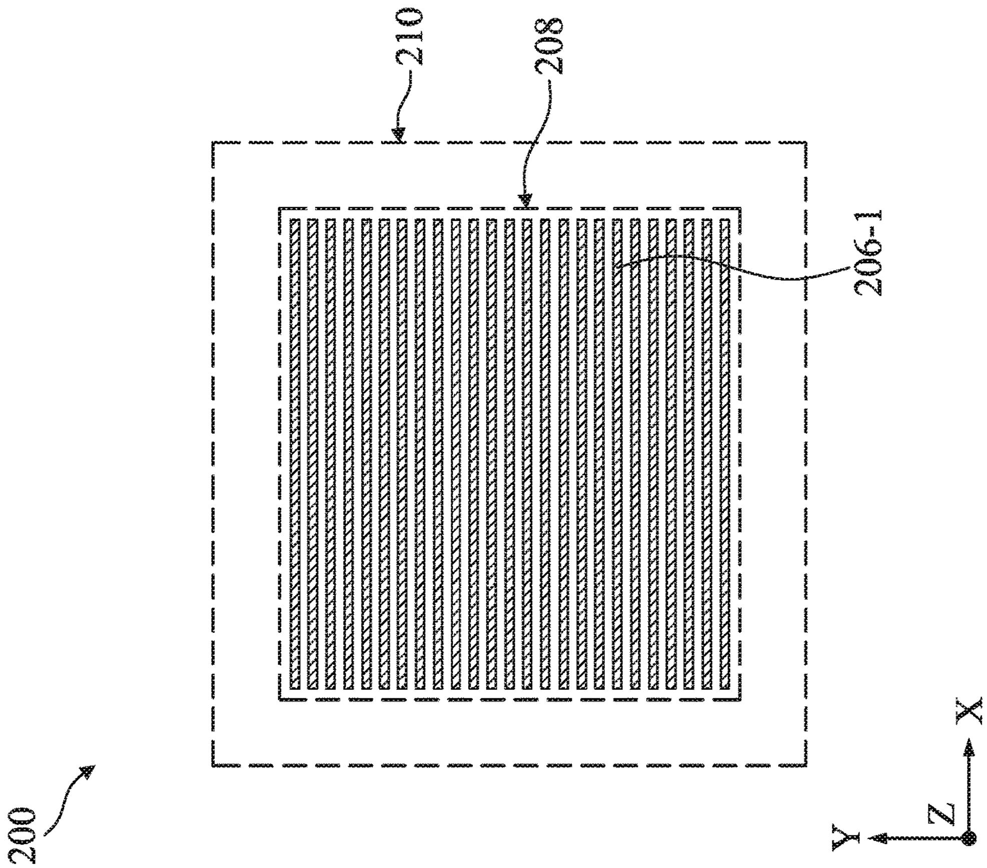

FIGS. 5A-5D illustrate some alternative embodiments of the top views of the workpiece 200 at the conclusion of the block 104. As shown in FIG. 5A, the TSV region 208 is not necessary in a square or rectangular shape, such as in an octagon shape instead. Consequently, the fins 206-1 in the TSV region 208 have a non-uniform length along the X direction. The guard ring region 210 is also in an octagon shape with the fins 206-2 in co-centric octagon rings. As to be shown in detail later on, the four corner regions 212 may accommodate corner stress relief (CSR) features and serve as CSR regions. As shown in FIG. 5B, the TSV region 208 is in an octagon shape, while the guard ring region 210 is in a square or rectangular shape. The four corner regions 212 as CSR regions are located within the guard ring region 210. As shown in FIG. 5C, the fins 206-1 in the TSV region 208 are not necessary arranged as straight lines, but may also extend continuously in forming a moat-like structure that surrounds a center of the TSV region 208, similar to the fins 206-2. As shown in FIG. 5D, the fins are all located inside the guard ring region 210 as the fins 206-1, such that the guard ring region 210 is cleared of fins. In other words, when a guard ring is formed in the guard ring region 210, the guard ring would not be in contact with an active region or other FEOL features.

Figure 6:
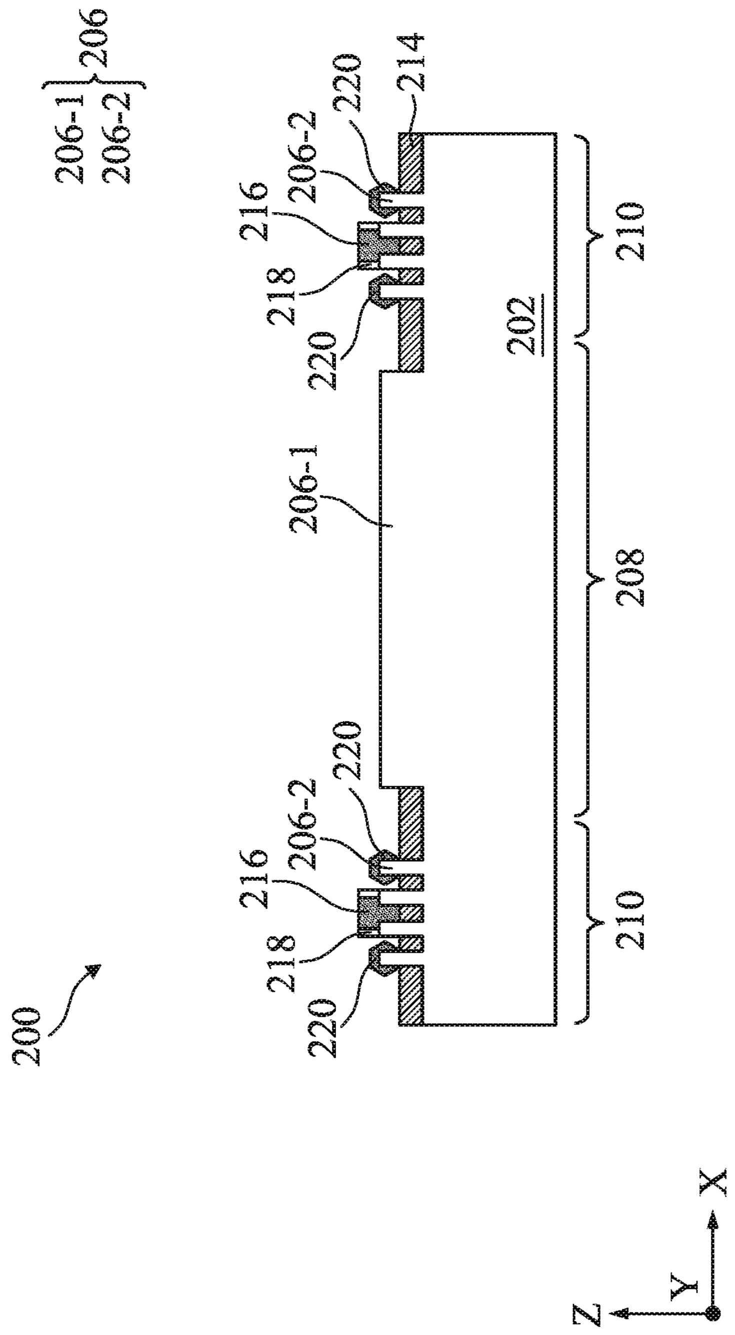

Referring to FIGS. 1 and 6, the method 100 includes a block 106 where extra FEOL features, such as an isolation structure 214, gate structures 216, gate spacers 218, and source/drain features 220, are formed on the workpiece 200. The isolation structure 214 may be formed of silicon oxide, silicon nitride, silicon oxynitride, fluoride-doped silicate glass (FSG), a low-k dielectric material, and/or other suitable insulating material. The isolation structure 214 may include a multi-layer structure, for example, having one or more thermal oxide liner layers. The isolation structure 214 may be shallow trench isolation (STI) features. In an embodiment, the isolation structure 214 is formed filling trenches between the fins 206 with an isolation material, followed by an etch-back process to recess below the fins 206. The etch-back process may include dry etching, wet etching, or other suitable etching process.

The gate structures 216 are formed in the guard ring regions 210 but out of the TSV region 208. A gate structure 216 may be deposited on one or multiple fins 206-2. In the depicted embodiment, the gate structures 216 are deposited across two fins 206-2 located in the middle of the fins 206-2 but not on the ones on the edge. A gate structure 216 partially covers the top surfaces of the two middle fins 206-2 and also fills the trench therebetween. The gate spacers 218 are deposited on sidewalls of the gate structures 216 and partially covers the top surfaces of the two middle fins 206-2. The gate spacers 218 may comprise a dielectric material, such as silicon oxide, silicon nitride, silicon oxynitride, silicon carbide, other dielectric material, or combinations thereof, and may comprise one or multiple layers of material. The gate spacers 218 may be formed by depositing a spacer material as a blanket over the workpiece 200. Then the spacer material is etched by an anisotropic etching process. Portions of the spacer material on the sidewalls of the gate structures 216 become the gate spacers 218. The fins 206-2 located at the edges of the fins 206-2 and the fins 206-1 located in the TSV region 208 are not covered by the gate spacers 218.

While not explicitly shown, the gate structures 216 include an interfacial layer interfacing the fins 206-2, a gate dielectric layer over the interfacial layer, and a gate electrode layer over the gate dielectric layer. The interfacial layer may include a dielectric material such as silicon oxide, hafnium silicate, or silicon oxynitride. The interfacial layer may be formed by chemical oxidation, thermal oxidation, atomic layer deposition (ALD), chemical vapor deposition (CVD), and/or other suitable method. The gate dielectric layer may include a high-k dielectric material, such as hafnium oxide. Alternatively, the gate dielectric layer may include other high-K dielectric materials, such as titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HMO), hafnium titanium oxide (HfTiO), $(Ba,Sr)TiO_3$ (BST), silicon nitride (SiN), silicon oxynitride (SiON), combinations thereof, or other suitable material. The gate dielectric layer may be formed by ALD, physical vapor deposition (PVD), CVD, oxidation, and/or other suitable methods. The gate electrode layer of the gate structures 216 may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the gate electrode layer may include titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), aluminum (Al), tungsten (W), nickel (Ni), titanium (Ti), ruthenium (Ru), cobalt (Co), platinum (Pt), tantalum carbide (TaC), tantalum silicon nitride (TaSiN), copper (Cu), other refractory metals, or other suitable metal materials or a combination thereof. The gate structures 216 are also referred to as metal gate structures 216.

The source/drain features 220 are epitaxially grown from the fins 206-2 at the edge and from portions of the fins 206-2 in the middle that are not covered by the gate structure 216 and the gate spacers 218, which are denoted as source/drain regions of the fins 206-2. The fins 206-1 may be covered by a mask layer, such as a resist mask, to block epitaxial growth from occurring in the TSV region 208. The source/drain features 220 may be deposited using vapor-phase epitaxy (VPE), ultra-high vacuum CVD (UHV-CVD), molecular beam epitaxy (MBE), and/or other suitable processes. When the source/drain features 220 is n-type, it may include silicon (Si) doped with an n-type dopant, such as phosphorus (P) or arsenic (As). When the source/drain features 220 is p-type, it may include silicon germanium (SiGe) doped with a p-type dopant, such as boron (B) or boron difluoride ($BF_2$). In some alternative embodiments not explicitly shown in the figures, the source/drain features 220 may include multiple layers. In one example, a source/drain feature 220 may include a lightly doped first epitaxial layer over source/drain region of the fin structure, a heavily doped second epitaxial layer over the lightly doped first epitaxial layer, and a capping epitaxial layer disposed over the heavily doped second epitaxial layer. The first epitaxial layer has a lower dopant concentration or a smaller germanium content (when germanium is present) than the second epitaxial layer to reduce lattice mismatch defects. The second epitaxial layer has the highest dopant concentration or the highest germanium content (when germanium is present) to reduce resistance and increase strain on the channels. The capping epitaxial layer may have a smaller dopant concentration and germanium content (when germanium is present) than the second epitaxial layer to increase etching resistance.

Figure 7:
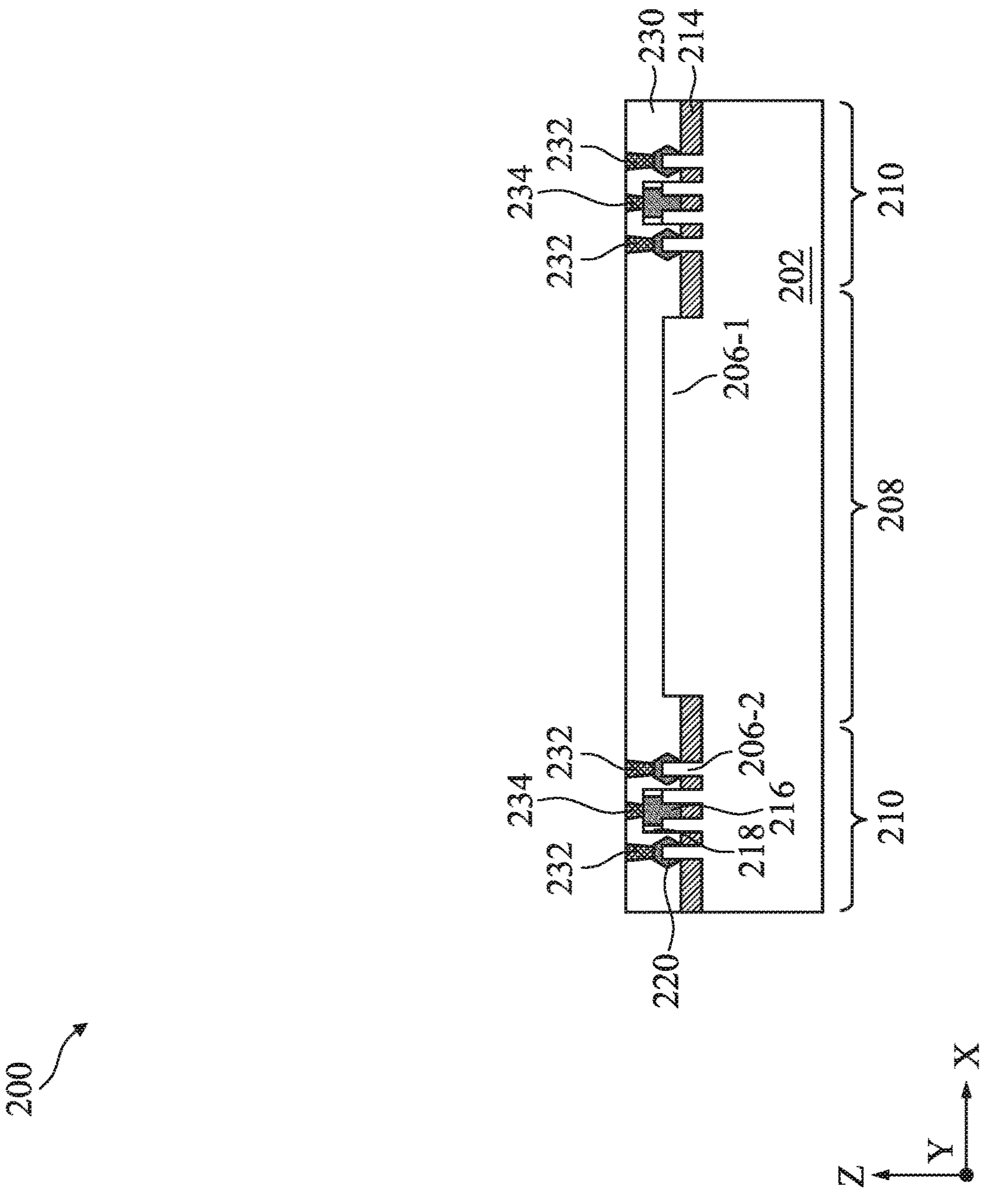

Referring to FIGS. 1 and 7, the method 100 includes a block 108 where MEOL features are formed over the substrate 202. In the depicted embodiment, the MEOL structures may include an interlayer dielectric (ILD) layer 230, source/drain contact plugs 232, and gate contact plugs 234. A source/drain contact plug 232 extends through the ILD layer 230 to be physically and electrically coupled to one of the source/drain features 220. A gate contact plug 234 extends through the ILD layer 230 to be physically and electrically coupled to one of the gate structures 216. In some embodiments, the ILD layer 230 may include silicon oxide, tetraethylorthosilicate (TEOS) oxide, un-doped silicate glass (USG), or doped silicon oxide such as borophosphosilicate glass (BPSG), fused silicate glass (FSG), phosphosilicate glass (PSG), boron doped silicate glass (BSG), and/or other suitable dielectric materials. The ILD layer 230 may be deposited using PECVD, FCVD, spin-on coating, or a suitable deposition technique. In some embodiments, after formation of the ILD layer 230, the workpiece 200 may be annealed to improve integrity of the ILD layer 230. Although not shown in figures, a contact etch stop layer (CESL) may be deposited before the ILD layer 230 is deposited such that the CESL is disposed between the ILD layer 230 and the source/drain features 220. The CESL may include silicon nitride or silicon oxynitride and may be deposited using CVD, ALD, or a suitable method.

The source/drain contact plugs 232 and the gate contact plugs 234 may include ruthenium (Ru), cobalt (Co), nickel (Ni), tungsten (W), copper (Cu), or other metals, as examples. In some embodiments not explicitly shown, the source/drain contact plugs 232 and the gate contact plugs 234 may include a barrier layer to interface the ILD layer 230. Such a barrier layer may include a metal nitride, such as titanium nitride, tantalum nitride, tungsten nitride, cobalt nitride, or nickel nitride. Additionally, in order to reduce contact resistance, a silicide feature may be disposed between the source/drain contact plug 232 and the source/drain feature 220. The silicide feature may include titanium silicide. The source/drain contact plug 232 and the gate contact plugs 234 may be deposited using CVD, PVD, or a suitable method. Excessive amounts of the conductive material may be removed from the top surface of the ILD layer 230 using a planarization process, such as a chemical mechanical polishing (CMP) process.

Figure 8:
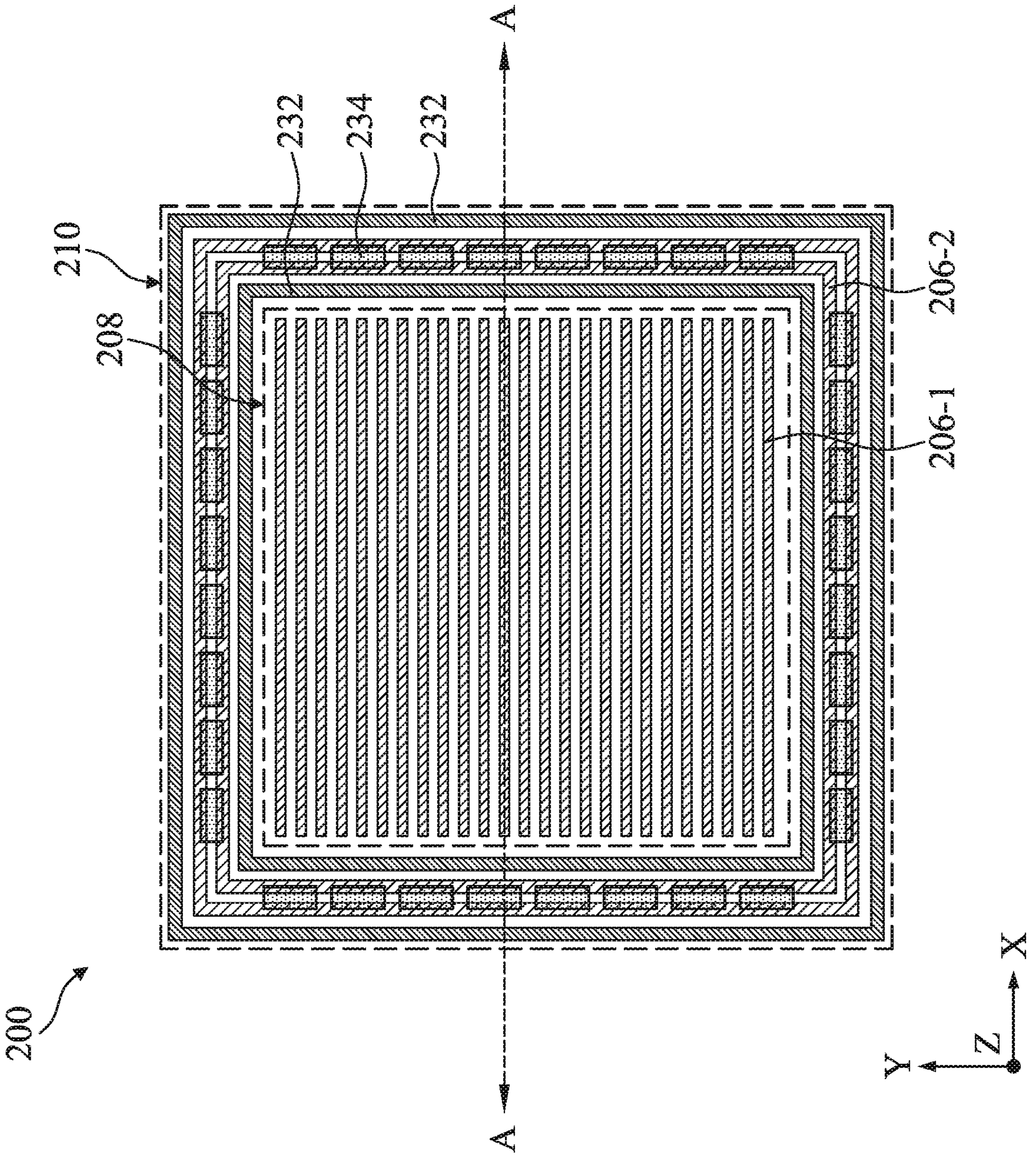

Reference is now made to FIG. 8, which is a top view of the workpiece 200 shown in FIG. 7. In fact, the cross-sectional view shown in FIG. 7 depicts structures along line A-A shown in FIG. 8. It is noted that, for simplicity of illustration, FIG. 8 does not include illustration of every single layer. For example, illustrations of the source/drain features 220, gate structures 216, gate spacers 218, and isolation structure 214 are omitted from FIG. 8. In some embodiments represented in FIG. 8, the source/drain contact plugs 232 extend continuously in forming a moat-like structure surrounding the TSV region 208. The moat-like structure includes an inner ring formed of a first source/drain contact plug 232 disposed on the inner-most fin 206-2 and an outer ring formed of a second source/drain contact plug 232 disposed on the outer-most fin 206-2. The gate contact plugs 234 are formed of separated segments and sandwiched between the inner ring and outer ring of the source/drain contact plugs 232. In furtherance of the depicted embodiment, the first source/drain contact plug 232 overlaps with an inner edge of the inner-most fin 206-2 but not an outer edge of the inner-most fin 206-2, and the second source/drain contact plug 232 overlaps with an outer edge of the outer-most fin 206-2 but not an inner edge of the outer-most fin 206-2. One reason for such an configuration is to increase lateral distance between the source/drain contact plugs 232 and the gate contact plugs 234 to reduce parasitic capacitance inside the guard ring structure.

Figure 9:
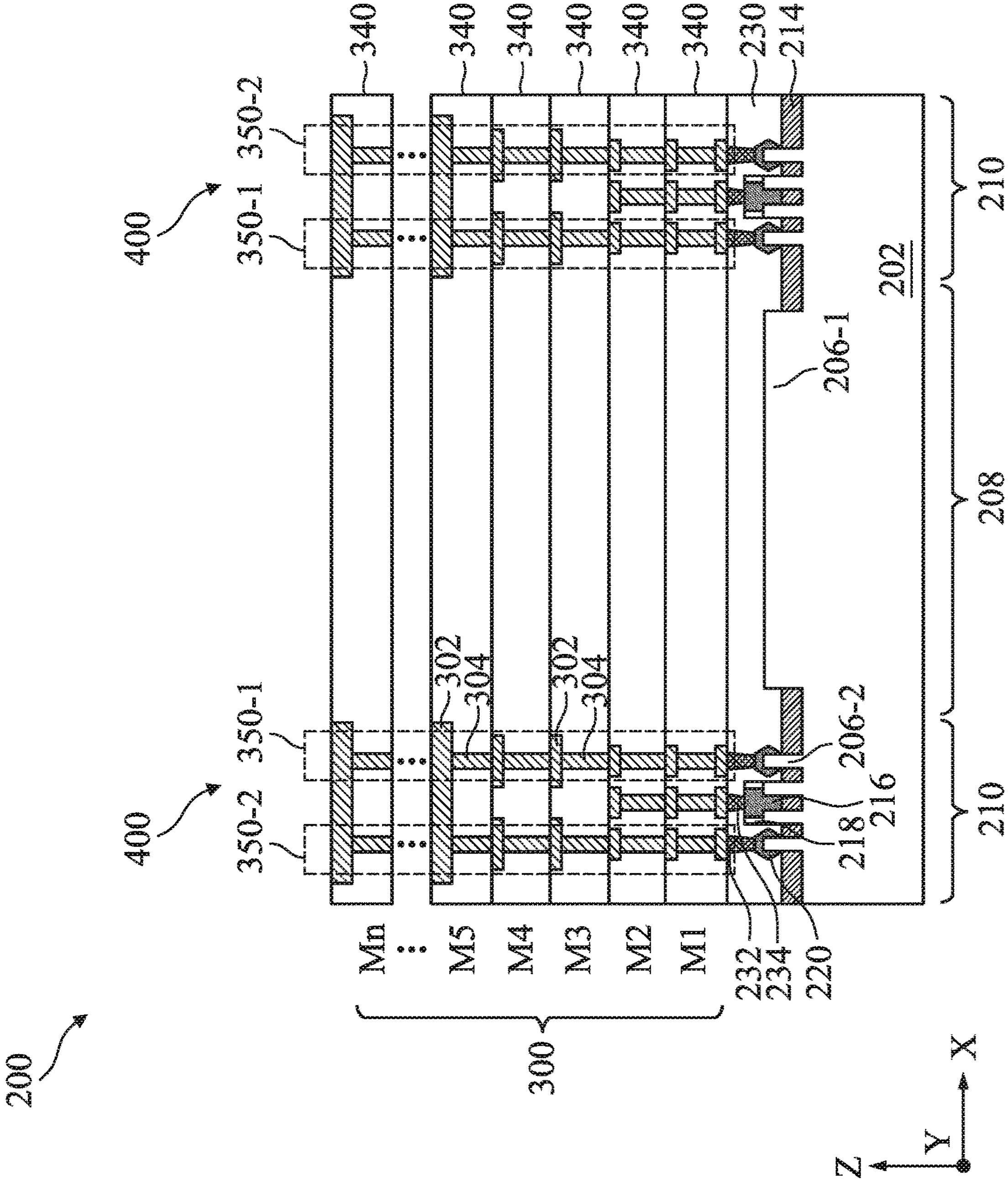

Referring to FIGS. 1 and 9, the method 100 includes a block 110 where an interconnect structure 300 is formed over the substrate 202 in a BEOL process. The interconnect structure 300 may include eight (8) to thirteen (13) metallization layers, denoted as metallization layers M1-Mn. Generally, the metallization layers M1-Mn comprise layers of conductive wiring comprising conductive lines (e.g., metal lines 302) and vias (e.g., vias 304) to electrically couple to the MEOL structures formed at the conclusion of the block 108, such as the source/drain contact plugs 232 and the gate contact plugs 234. The layers of conductive wiring are formed in layers of a dielectric material, such as inter-metal dielectric (IMD) layers 340. The IMD layers 340 may comprise a low dielectric constant or an extreme low dielectric constant (ELK) material, such as an oxide, $SiO_2$, borophosphosilicate glass (BPSG), TEOS, spin on glass (SOG), undoped silicate glass (USG), fluorinated silicate glass (FSG), high-density plasma (HDP) oxide, or plasma-enhanced TEOS (PETEOS). A planarization process, such as a CMP process, may be performed to planarize each of the IMD layers 340.

The metallization layers M1-Mn may be formed, e.g., using a plating and etching process or through a damascene or dual-damascene process, in which openings are etched into the corresponding dielectric layer and the openings are filled with a conductive material. Using a damascene process for the first metallization layer M1 may include a deposit of an additional dielectric layer (not shown). The metallization layers M1-Mn may be formed of any suitable conductive material, such as a highly-conductive metal, low-resistive metal, elemental metal, transition metal, or the like. In an embodiment the metallization layers M1-Mn may be formed of copper, although other materials, such as tungsten, aluminum, gold, or the like, could alternatively be utilized. In an embodiment in which the metallization layers M1-Mn is formed of copper, the metallization layers M1-Mn may be deposited by electroplating techniques, although any method of formation could alternatively be used.

The metallization layers M1-Mn may include a liner and/or a barrier layer. For example, a liner (not shown) may be formed over the dielectric layer in the openings, the liner covering the sidewalls and bottom of the opening. The liner may be either tetraethylorthosilicate (TEOS) or silicon nitride, although any suitable dielectric may alternatively be used. The liner may be formed using a plasma enhanced chemical vapor deposition (PECVD) process, although other suitable processes, such as physical vapor deposition or a thermal process, may alternatively be used. The barrier layer (not shown) may be formed over the liner (if present) and covering the sidewalls and bottom of the opening. The barrier layer may be formed using a process such as chemical vapor deposition (CVD), physical vapor deposition (PVD), plasma enhanced CVD (PECVD), plasma enhanced physical vapor deposition (PEPVD), atomic layer deposition (ALD), combinations of these, or the like. The barrier layer may comprise tantalum nitride, although other materials, such as tantalum, titanium, titanium nitride, combinations of these, and the like may alternatively be used.

As discussed above, the source/drain contact plugs 232 form a moat-like structure with rings, such as an inner ring and an outer ring as depicted in FIG. 8. The metal lines 302 and vias 304 stacking above the first source/drain contact plugs 232 vertically extend the inner ring to the top metallization layer Mn, and the metal lines 302 and vias 304 stacking above the second second/drain contact plugs 232 vertically extend the outer ring to the top metallization layer Mn, which resembles an inner sidewall (denoted as sidewall 350-1) and an outer sidewall (denoted as sidewall 350-2), respectively, of a cylinder or a prism with an axis along the Z direction. The metal sidewalls 350-1 and 350-2 are electrically connected to the source/drain features 220 of the fins 206-2, which may further be grounded. Thus, charges that are often accumulated during the BEOL process may be discharged through these metal sidewalls, which may prevent PID from occurring. Further, as shown in FIG. 9, the metal lines 302 at higher metallization layers, such as M5 and above, may span over the inner sidewall 350-1 and the outer sidewall 350-2 to electrically short the two metal sidewalls to reduce electrical resistance.

Sandwiched between the metal sidewalls 350-1 and 350-2 is the metal lines 302 and vias 304 in lower metallization layers, such as M1 and M2, stacking above the gate contact plugs 234. Since the gate contact plugs 234 are discrete segments as depicted in FIG. 8, these BEOL features above the gate contact plugs 234 are also segmented structures, which resembles a segmented middle sidewall between the inner sidewall 350-1 and the outer sidewall 350-2. The segmented middle sidewall is lower in height than the inner sidewall 350-1 and the outer sidewall 350-2. The metal lines 302 at higher metallization layers shorting the inner sidewall 350-1 and the outer sidewall 350-2 also overhang above this segmented middle sidewall. Since the gate contact plugs 234 is electrically floating, the segmented middle sidewall is also electrically floating. One reason to have the segmented middle sidewall is to increase metal density at the lower metallization layers and to increase mechanical strength of the guard ring. The inner, middle, and outer metal sidewalls collectively define a guard ring structure (or simply as a guard ring) 400. In this manner, the guard ring 400 provide a structural barrier and/or electrical barrier to protect the devices and materials near the TSV region 208.

Figure 10:
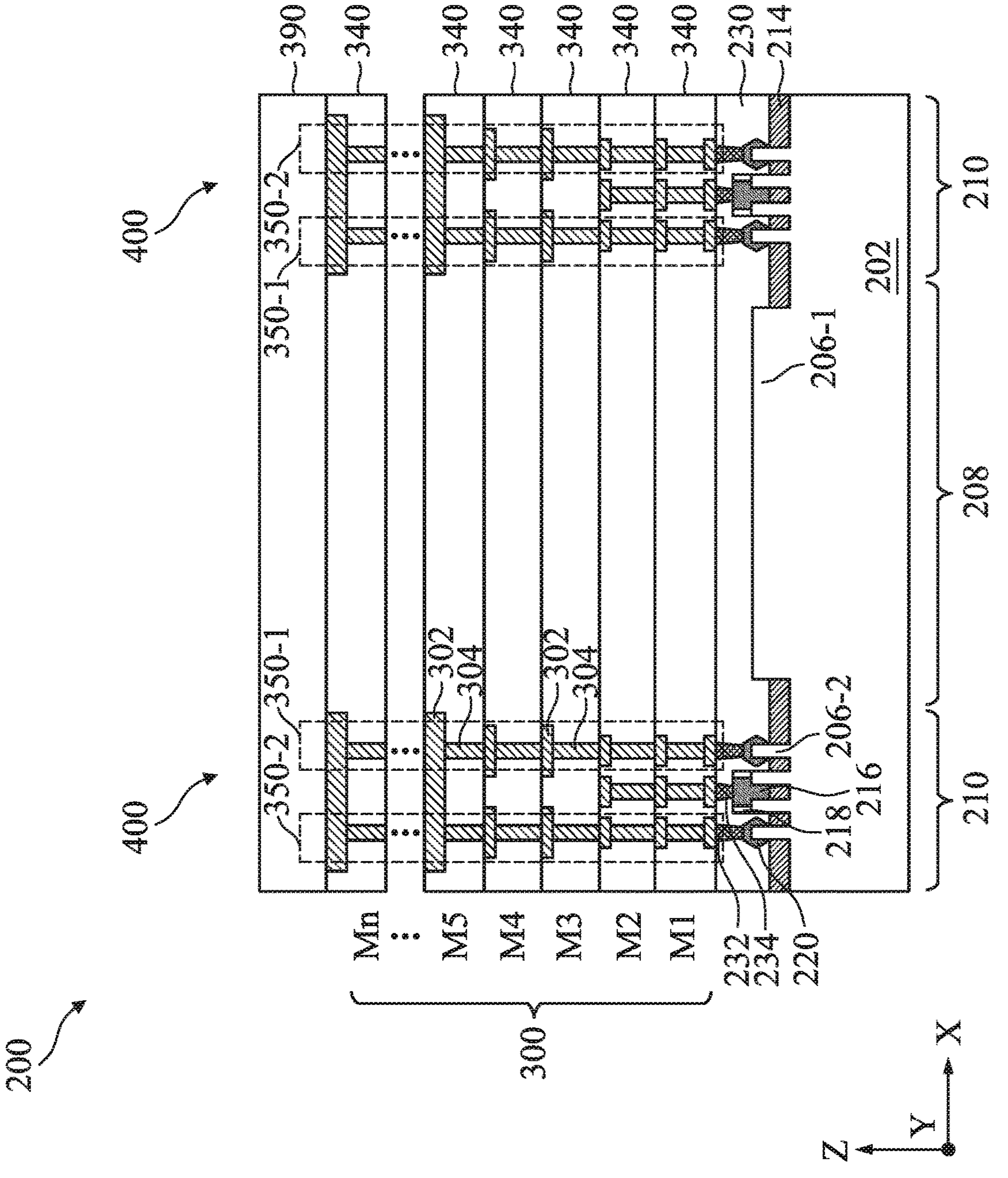

Referring to FIGS. 1 and 10, the method 100 includes a block 112 where an additional IMD layers 390 is formed on the top metallization layer Mn. In some embodiments, the additional IMD layer 390 may be similar to the IMD layers 340 in terms of composition and formation processes. In the depicted embodiments, a thickness of the additional IMD layer 390 may be larger than a thickness of the IMD layer 340. In some instances, the thickness of the additional IMD layer 390 may be about 1.3 times to 2 times of the IMD layer 340.

Figure 11:
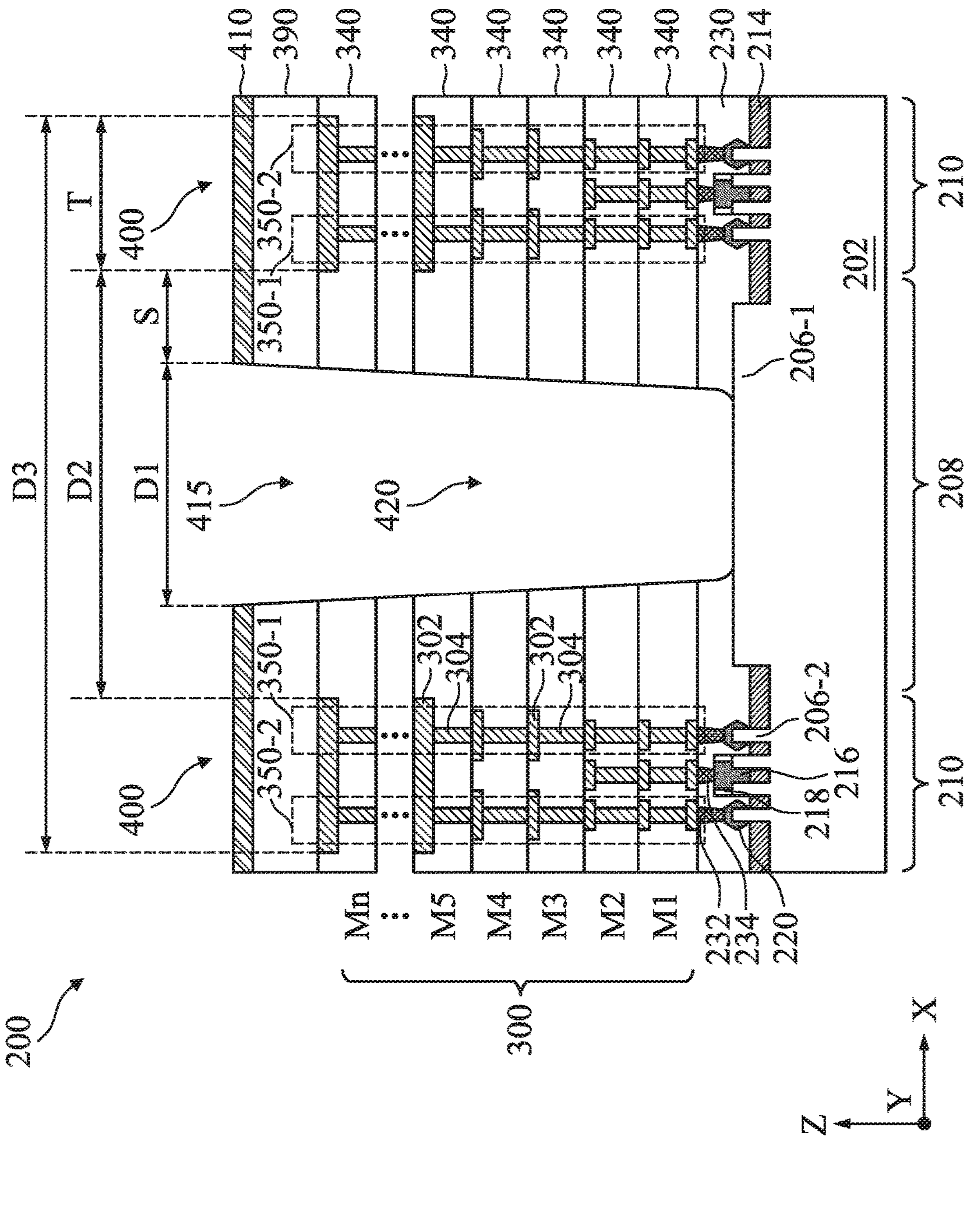

Referring to FIGS. 1 and 11, the method 100 includes a block 114 where an opening 420 is formed and exposes the active regions (e.g., fins 206-1) in the TSV region 208. To form the opening 420, a masking layer 410 is formed over the interconnect structure 300. The masking layer 410 may include photoresist, silicon oxide, silicon nitride, silicon carbide, aluminum oxide, or titanium nitride. In one embodiment, the masking layer 410 may be a photoresist layer having a thickness between about 5 μm and about 15 μm. The photoresist layer has a composition different from the IMD layers that allows selectively etching the IMD layers. In this embodiment, the masking layer 410 may be deposited using spin-on coating or FCVD. The deposited masking layer 410 then undergoes a pre-exposure baking process, exposure to radiation reflected from or transmitted through a photomask, a post-exposure baking process, and developing process, so as to form a patterned masking layer 410. The patterned masking layer 410 has a mask opening 415. The patterned masking layer 410 is then applied as an etch mask to etch the IMD layers within the region circled by the guard ring 400. The etch process here may be a dry etch process (e.g., a reactive ion etching (RIE) process). In some instances, an example dry etch process may implement an oxygen-containing gas (e.g., $O_2$), a fluorine-containing gas (e.g., $SF_6$ or $NF_3$), a chlorine-containing gas (e.g., $Cl_2$ and/or $BCl_3$), a bromine-containing gas (e.g., HBr), an iodine-containing gas, other suitable gases and/or plasmas, and/or combinations thereof. The etching at block 114 terminates when the opening 420 reaches a top surface of the fins 206-1. That is, the opening 420 may extend through all the IMD layers and the ILD layer 230 in some embodiments. The termination of the etching at block 114 may be controlled by time or by an etch rate change when the etching reaches the fins 206-1. In some implementations, the etch chemistry at block 114 is selected such that the etch process at block 114 etches the fins 206-1 at a slower rate. In some embodiments represented in FIG. 11, the opening 420 tapers downward.

In some embodiments represented in FIG. 11, the mask opening 415 has a first diameter D1, opposing inner edges of the guard ring 400 has a second diameter D2, and the opposing outer edges of the guard ring 400 has a third diameter D3. As shown in FIG. 11, the third diameter D3 is greater than the second diameter D2, and the second diameter D2 is greater than the first diameter D1. In some embodiments, the first diameter D1 may be between about 2 μm and about 5 μm. While the first diameter D1 is largely determined by the design requirement, several factors have to be considered. First, while a larger first diameter D1 may reduce contact resistance, a larger first diameter D1 requires greater second and third diameters D2 and D3 for accommodation, which can take additional space or requires layout changes. Second, a smaller first diameter D1 can result in an aspect ratio (i.e., the vertical depth of the first opening 420/the first diameter D1) that is greater than 10. Such a high aspect ratio can lead to challenges in the etching processes and the subsequent metal fill process. The difference between the second diameter D2 and the first diameter D1 determines a spacing S, which refers to a radial thickness of the residual IMD layers within the guard ring 400 and not removed during the formation of the opening 420. In some implementations, the spacing S is between about 0.1 μm and about 0.7 μm. This range is not trivial. When the spacing S is below 0.1 μm, the residual IMD layers may not have sufficient thickness to absorb the stress generated by the to-be-formed via structure. Additionally, when the spacing S is below 0.1 μm, the spacing S may not provide sufficient tolerance when the mask opening 415 is misaligned or off centered. For example, when the spacing S is below 0.1 μm and the mask opening 415 is misaligned, the etching of the first opening 420 may completely remove the residual IMD layers for one side of the guard ring 400 and damage the guard ring 400. That may cause direct metal-to-metal contact between the inner edges of the guard ring 400 and the through via, which may also lead to concentration of stress or delamination. When the spacing S is greater than 0.7 μm, the guard ring 400 may take up too much real estate, which may be wasteful. The second diameter D2 may be substantially equal to summation of two times of the spacing S and the first diameter D1 (i.e., 2S+D1=D2). The second diameter D2 may be between about 2.2 μm and about 6.4 μm.

The difference between the third diameter D3 and the second diameter D2 is determined by a radial thickness T of the topmost surface of the guard ring 400. As shown in FIG. 11, the radial thickness of the topmost surface of the guard ring structure may just be the radial thickness T of the metal line 302 in the top metallization layer Mn. In some embodiments, the radial thickness T may be between about 0.3 um and about 1.2 um. This thickness range is not trivial. When the radial thickness T is smaller than 0.3 um, the guard ring 400 does not have the structural strength or integrity to isolate the stress generated by the through via within the guard ring 400. When the radial thickness T is greater than 1.2 um, the thick guard ring 400 may take too much space. The third diameter D3 may be substantially equal to summation of two times of the radial thickness T and the second diameter D2 (i.e., 2T+D2=D3). The third diameter D3 may be between about 2.8 μm and about 8.8 μm.

Figure 12:
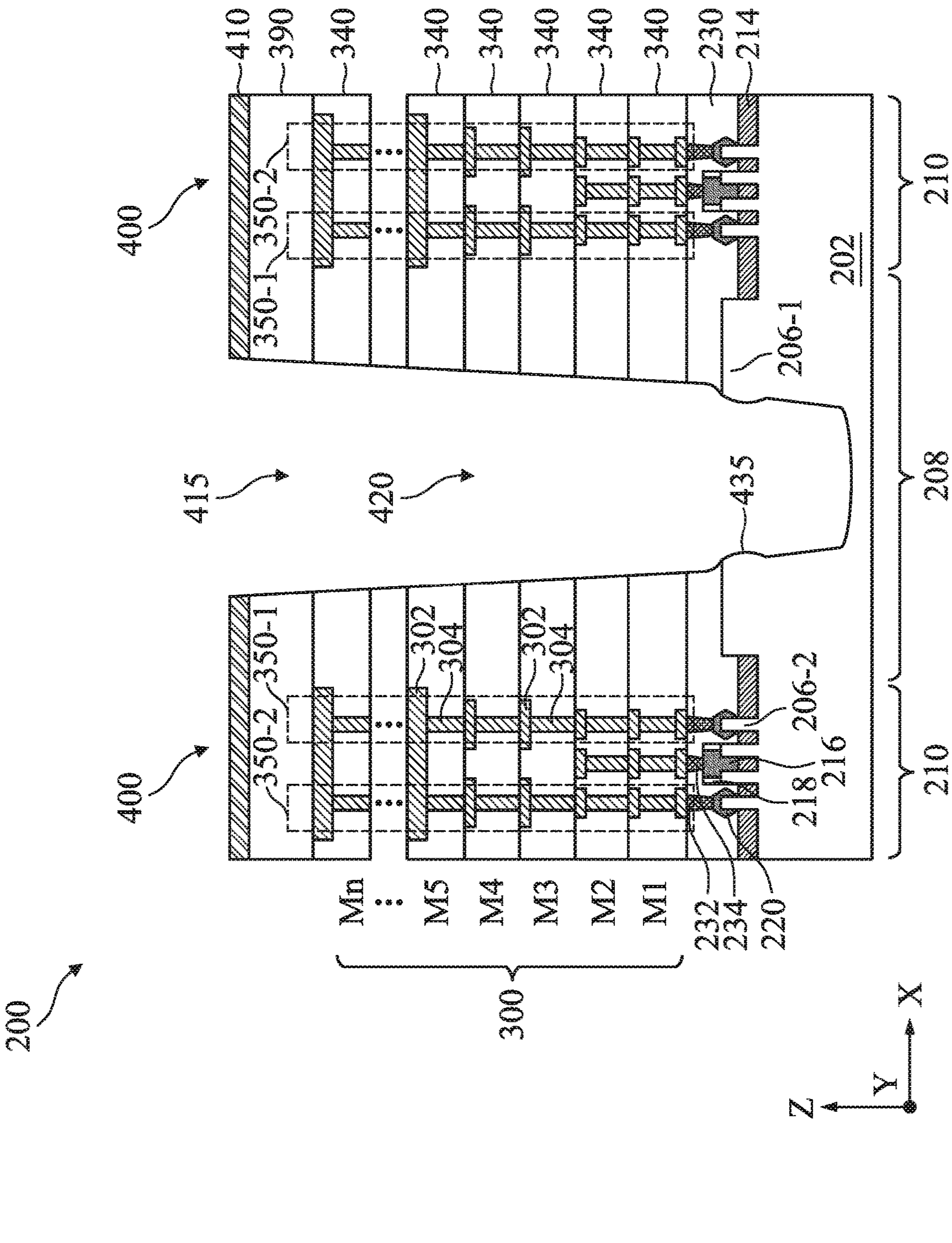

Referring to FIGS. 1 and 12, the method 100 includes a block 116 where the opening 420 is extended though the fins 206-1 and into the substrate 202. At block 116, an etch process different from the one at block 114 is used to extend the opening 420 through the fins 206-1. In some embodiments, a cyclic etch process may be used at block 116. The cyclic etch process may include multiple etch cycles and multiple deposition cycles. In some instances, each of the etch cycles is followed immediately by a deposition cycle. In one example, each of the etch cycles includes use of a fluorine-containing etchant, such as sulfur hexafluoride ($SF_6$) or nitrogen trifluoride ($NF_3$), which etches the fins 206-1 and the substrate 202. Each of the deposition cycles includes use of a fluorocarbon species, such as hexafluoroethane ($C_2F_6$) or octafluorocyclobutane ($C_4F_8$), which may form a silicon-carbon polymer along freshly etched sidewalls. As the polymer passivates the sidewalls of the opening, lateral etching is reduced, thereby allowing high-aspect-ratio and directional etching into the fins 206-1 and the substrate 202. This cyclic etch process may also be referred to as Bosch process. Once the opening 420 is extended into the substrate 202 by a depth between about 10 μm and about 15 μm, the etching process is stopped. The cyclic etch process may result in scalloped sidewall profiles. In some embodiments illustrated in FIG. 12, as a continuous fin 206-1 is broken into two segments at block 116, the cyclic etch process may leave behind a circular ridge 435 at the broken edges of the fins 206-1. The circular ridge 435 may have a height similar to a height of the fins 206-1.

In some other embodiments not explicitly illustrated in the figures, an extra etch process may be optionally performed to smooth sidewalls of the opening 420 by removing the circular ridge 435. Because the circular ridge 435 may be largely disposed on the broken edges of the fins 206-1, the extra smoothing etch process may be selected to be selective to the semiconductor material of the fins 206-1, such as silicon (Si). An example dry etch process may include use of chlorine ($Cl_2$), sulfur hexafluoride ($SF_6$), nitrogen trifluoride ($NF_3$), or a combination thereof. In at least some embodiment, the extra smoothing etch process does not use carbon-containing species to reduce generation or polymers on sidewalls of the opening 420.

Figure 13:
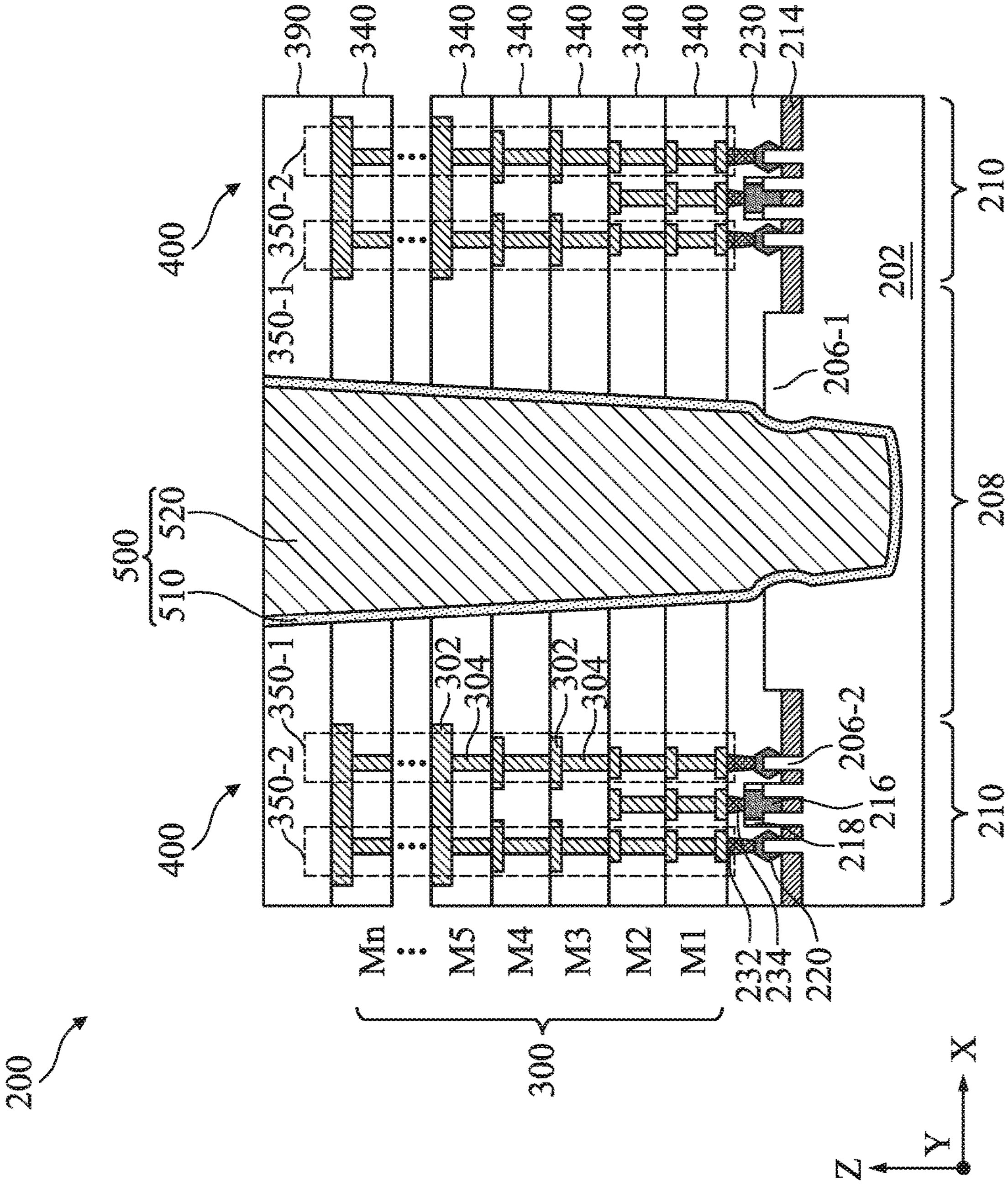

Referring to FIGS. 1 and 13, the method 100 includes a block 118 where a through via 500 is formed in the opening 420. In some embodiments, the through via 500 may include a barrier layer 510 and a metal fill layer 520. As shown in FIG. 13, the barrier layer 510 spaces the metal fill layer 520 apart from the IMD layers within the guard ring 400. In some implementations, the barrier layer 510 may include tantalum nitride (TaN), titanium nitride (TiN), tungsten nitride (WN), aluminum nitride (AlN), or combinations thereof. The metal fill layer 520 may include copper (Cu), aluminum (Al), cobalt (Co), copper alloy, tantalum (Ta), titanium (Ti), or tungsten (W). In one embodiment, the barrier layer 510 includes titanium nitride (TiN) and the metal fill layer 520 includes copper (Cu). To form the through via 500, the barrier layer 510 is first deposited using PVD, CVD, MOCVD, ALD, or a combination thereof. Then the metal fill layer 520 is deposited using electroplating, PVD, CVD, electroless plating, or a suitable method. In one embodiment, the metal fill layer 520 is formed using electroplating. In this embodiment, after the formation of the barrier layer 510, a seed layer may be deposited, using PVD or a suitable process, over the workpiece 200, including over surfaces of the barrier layer 510. Then the metal fill layer 520 may be deposited over the seed layer using electroplating. In the embodiment where electroplating is used, the seed layer may include copper (Cu), titanium (Ti), or a combination thereof and the metal fill may include copper (Cu). The seed layer may be considered part of the metal fill layer 520. After both the barrier layer 510 and the metal fill layer 520 are deposited over the workpiece 200 and into the opening 420, a planarization process, such as a CMP, may be performed to remove any residual masking layer 410 and any excess material over the top IMD layer 390.

Figure 14:
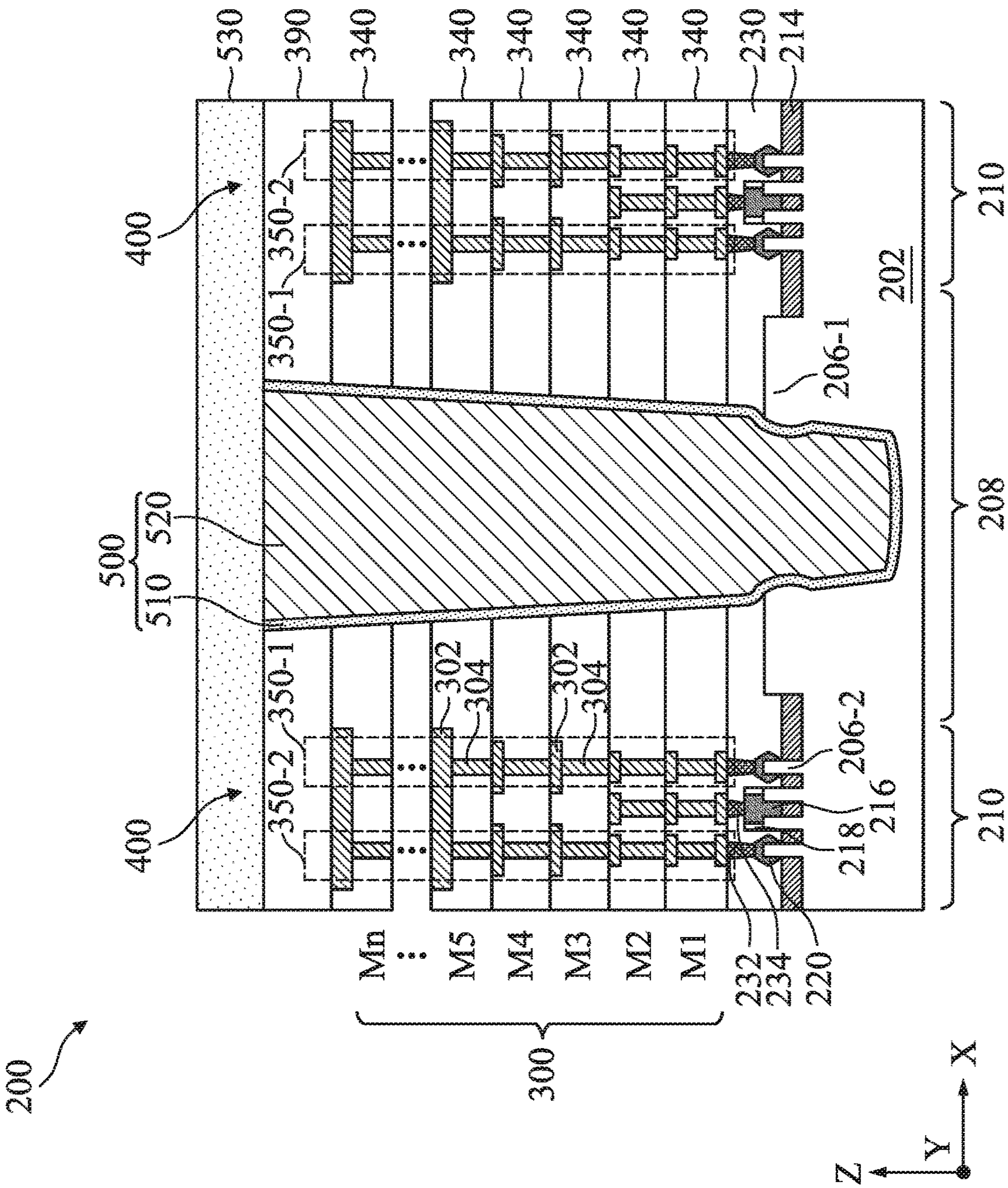

Referring to FIGS. 1 and 14, the method 100 includes a block 120 where a first top dielectric layer 530 is deposited over the through via 500 and the guard ring 400. In some embodiments, the first top dielectric layer 530 may be substantially similar to the ILD layer 230 or the IMD layer 390 (or any of the IMD layers in the interconnect structure 300) in terms of compositions and formation processes. In the depicted embodiments, the first top dielectric layer 530 may include silicon oxide, tetraethylorthosilicate (TEOS) oxide, un-doped silicate glass (USG), or doped silicon oxide such as borophosphosilicate glass (BPSG), fused silicate glass (FSG), phosphosilicate glass (PSG), boron doped silicate glass (BSG), low-k dielectric material, other suitable dielectric material, or combinations thereof.

Figure 15:
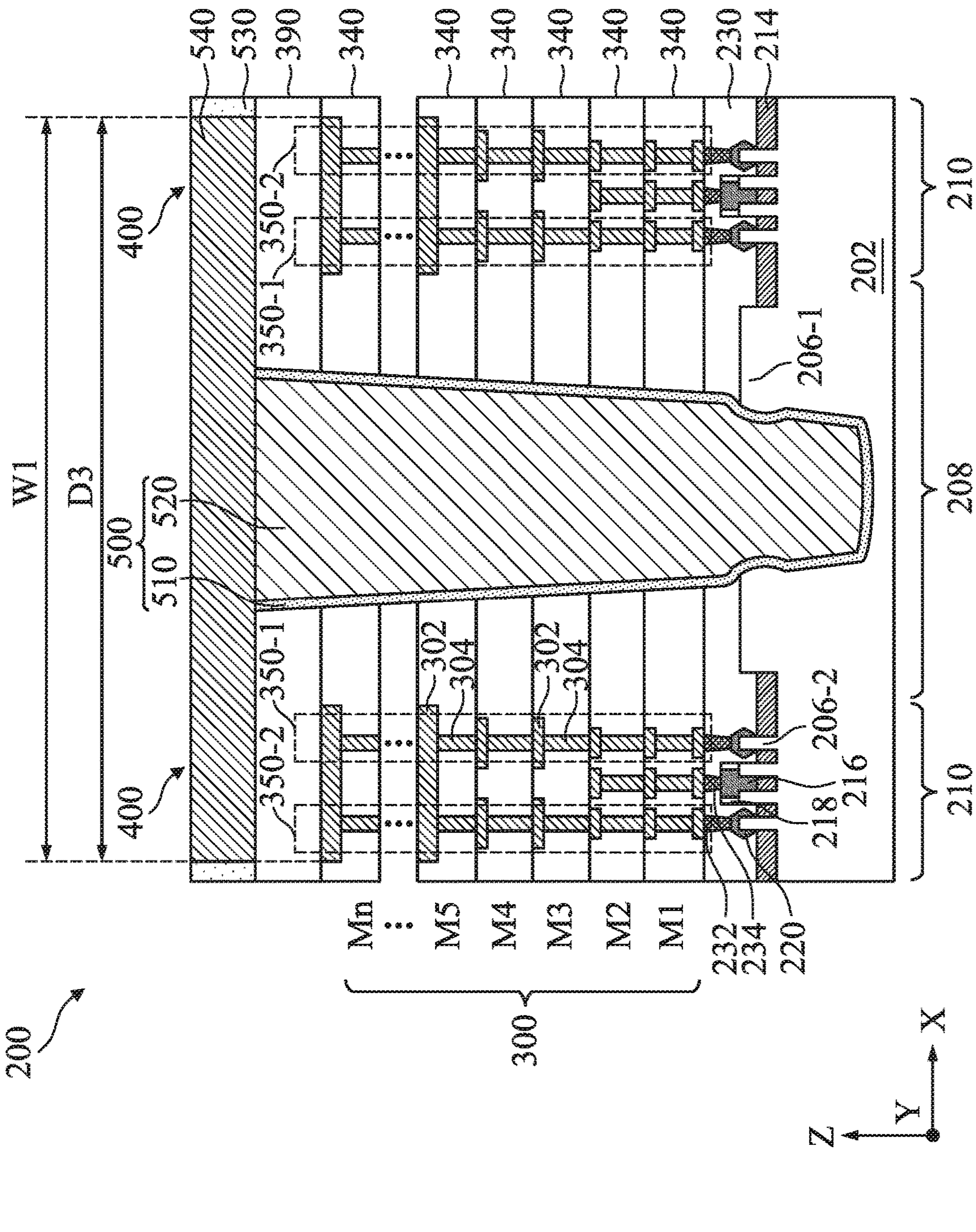

Referring to FIGS. 1 and 15, the method 100 includes a block 122 where a first top metal feature 540 is formed over the through via 500 and the guard ring 400. As shown in FIG. 15, the first top metal feature 540 is formed in the first top dielectric layer 530. To form the first top metal feature 540, a top metal opening may be formed in the first top dielectric layer 530 using a combination of photolithography processes and etching processes. For example, at least one hard mask is deposited over the first top dielectric layer 530 using CVD or a suitable process. A photoresist layer is then deposited over the at least one hard mask layer using spin-on coating. The deposited photoresist layer may undergo a pre-exposure baking process, exposure to radiation reflected from or transmitted through a photomask, a post-exposure baking process, and developing process, so as to form a patterned photoresist. The at least one hard mask layer is then etched using the patterned photoresist as an etch mask to form a patterned hard mask. The patterned hard mask is then applied as an etch mask to etch the first top dielectric layer 530. In some alternative embodiment, a patterned photoresist layer is applied as an etch mask to etch the first top dielectric layer 530. The etching of the first top dielectric layer 530 may include a dry etch process, a wet etch process, or a combination thereof. After the first top dielectric layer 530 is patterned to form the top metal opening, the residual patterned photoresist may be removed by ashing, stripping, or selective etching. After the top metal opening is formed in the first top dielectric layer 530, a metal material is deposited over the workpiece 200, including over the top metal opening. The metal material may include copper (Cu), cobalt (Co), nickel (Ni), aluminum (Al), or a metal alloy, such as aluminum-copper alloy (Al—Cu). After the deposition of the metal material, the workpiece 200 is planarized using, for example, a CMP process to remove excess materials and provide a planar top surface for the workpiece 200. After the planarization, the first top metal feature 540 is formed. As shown in FIG. 15, the first top metal feature 540 spans over and is in contact with top surfaces of the through via 500. When viewed along the Y direction, the first top metal feature 540 includes a width W1 along the X direction. The width W1 of the first top metal feature 540 is selected to cover at least a portion of the guard ring 400. In the embodiments represented in FIG. 15, the width W1 of the first top metal feature 540 is substantially equal to the third diameter D3 such that edges of the first top metal feature 540 vertically align with outer edges of the guard ring 400 along the Z direction. In alternative embodiments, the width W1 may be greater than or smaller than the third diameter D3.

Figure 16:
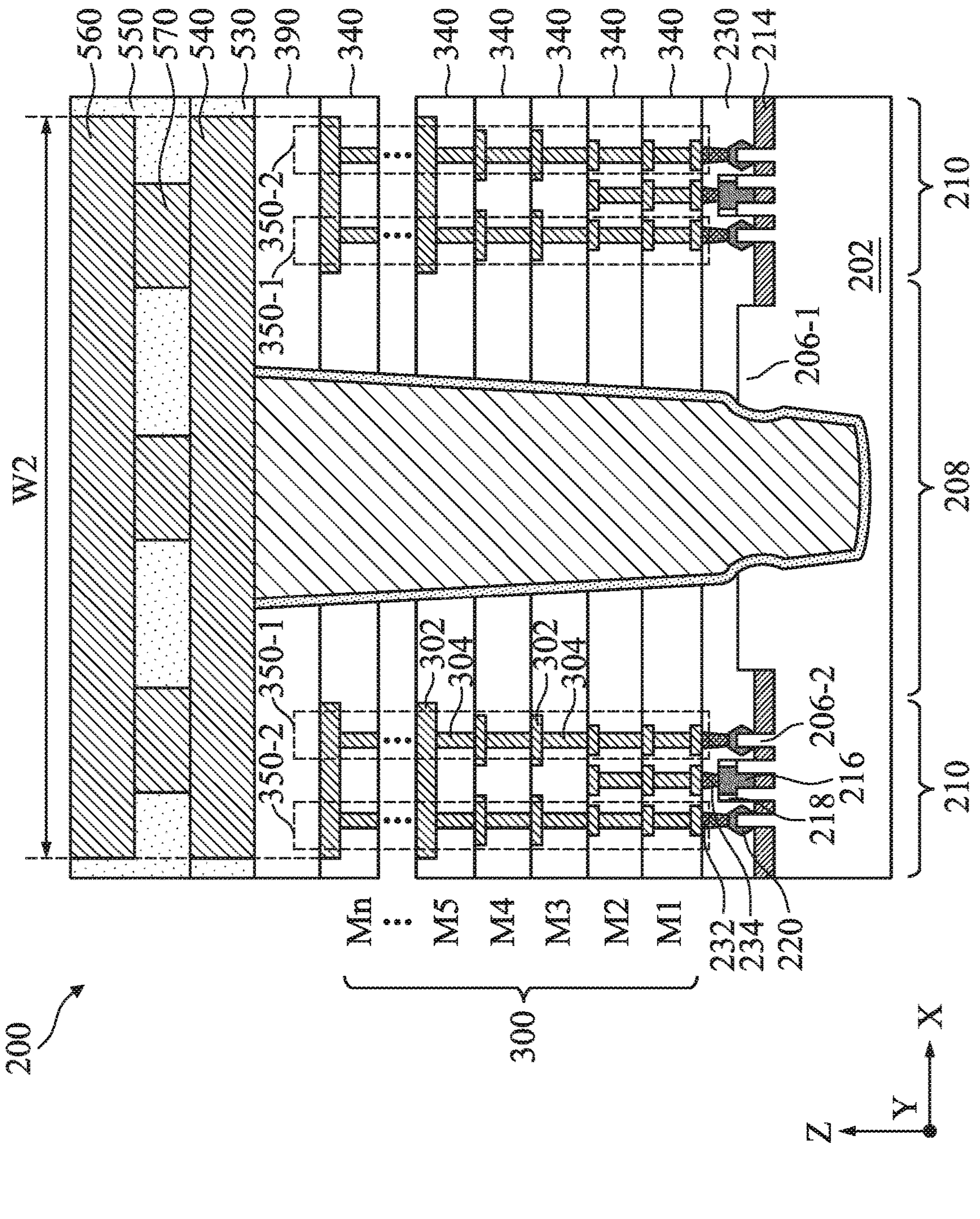

Referring to FIGS. 1 and 16, the method 100 includes a block 124 where a second top dielectric layer 550 is deposited over the first top dielectric layer 530 and a second top metal feature 560 and top vias 570 are formed in the second top dielectric layer 550. In some embodiments, the second top dielectric layer 550 may be substantially similar to the first top dielectric layer 530 in terms of compositions and formation processes. The second top dielectric layer 550 may include silicon oxide, tetraethylorthosilicate (TEOS) oxide, un-doped silicate glass (USG), or doped silicon oxide such as borophosphosilicate glass (BPSG), fused silicate glass (FSG), phosphosilicate glass (PSG), boron doped silicate glass (BSG), low-k dielectric material, other suitable dielectric material, or combinations thereof. As shown in FIG. 16, the second top metal feature 560 and top vias 570 are formed in the second top dielectric layer 550. The top vias 570 electrically connect the first top metal feature 540 and the second top metal feature 560. The second top metal feature 560 and top vias 570 may be substantially similar to the first top metal feature 540 in terms of compositions and formation processes, such as using a combination of photolithography processes and etching processes to form openings corresponding to the second top metal feature 560 and top vias 570 and filling the openings with metal material, such as copper (Cu), cobalt (Co), nickel (Ni), aluminum (Al), or a metal alloy, such as aluminum-copper alloy (Al—Cu). After the deposition of the metal material, the workpiece 200 is planarized using, for example, a CMP process to remove excess materials and provide a planar top surface for the workpiece 200. As shown in FIG. 16, the second top metal feature 560 spans over and is in electrical connection with top surfaces of the first top metal feature 540 through the vias 570. When viewed along the Y direction, the second top metal feature 560 includes a width W2 along the X direction. The width W2 of the second top metal feature 560 is selected to be the same as the width W1 of the first top metal feature 540, such that edges of the second top metal feature 560 vertically align with edges of the first top metal feature 540 along the Z direction. In alternative embodiments, the width W2 may be greater than or smaller than the width W1.

Figure 17:
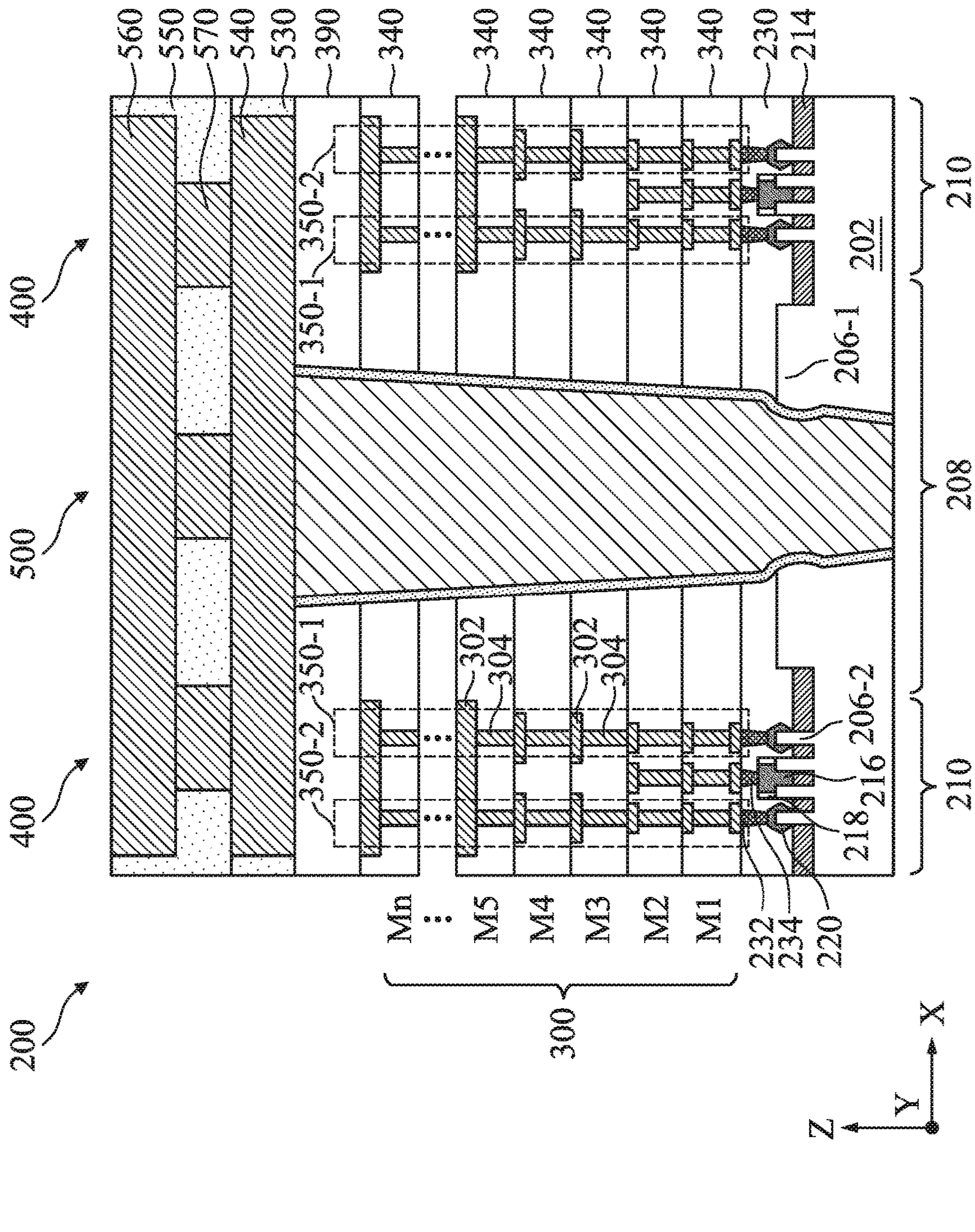

Referring to FIGS. 1 and 17, the method 100 includes a block 126 where further processes are performed. Such further processes may include grinding and polishing the substrate 202 to expose a bottom surface of the through via 500. Once the bottom surface of the through via 500 is exposed, the through via 500 extends completely through the interconnect structure 300 and the substrate 202. The through via 500 is also termed as a through-silicon or through-substrate via (TSV) 500. The guard ring 400 is grounded though the electrical connection with the source/drain features 220 which are further biased to a ground voltage reference. The guard ring 400 is electrically isolated from the through via 500 but nonetheless provides a multi-layer structural and electrical barrier surrounding the through via 500. Instead of extending through the substrate 202 in a region that is cleared out any FEOL features, the through via 500 in the depicted embodiment extends through active regions formed on the substrate 202, such as the fins 206-1. By the direct contact with the active regions, the through via 500 gets better structural support from the substrate, and the stress created around the through via 500 is better spread into the substrate.

FIGS. 18A-18D illustrate some embodiments of see-through top views of the workpiece 200 at the conclusion of the block 126. It is noted that, for simplicity of illustration, FIGS. 18A-18D do not include illustration of every single layer. For example, it is the TSV 500, the top metal line 302 in the top metallization layer Mn of the guard ring 400, the fins 206-1 that the TSV 500 extends through, and the fins 206-2 that the TSV 500 lands on are depicted, while other features may just be omitted. Further depicted in FIGS. 18A-18D are a transition region 211 surrounding the guard ring region 210 and dummy inserts 580 formed in the transition region 211. The transition region 211 provides further separation between the guard ring region 210 and a device region outside of the transition region 211. The device region accommodates functional devices, such as transistors and capacitors. The outside boundary of the transition region 211 defines a keep-out zone (KOZ) for the functional devices, whereas all the functional devices in the device region are placed outside of the KOZ. In some implementations, a width W3 of the transition region 211 is between about 0.5 μm and about 1.5 μm. This range is not trivial. When the width W3 is below 0.5 μm, a portion of the stress generated by the through via 500 may still spread to the device region. When the width W3 is larger than 1.5 μm, the KOZ may take up too much real estate, which may be wasteful.

Figure 18A:
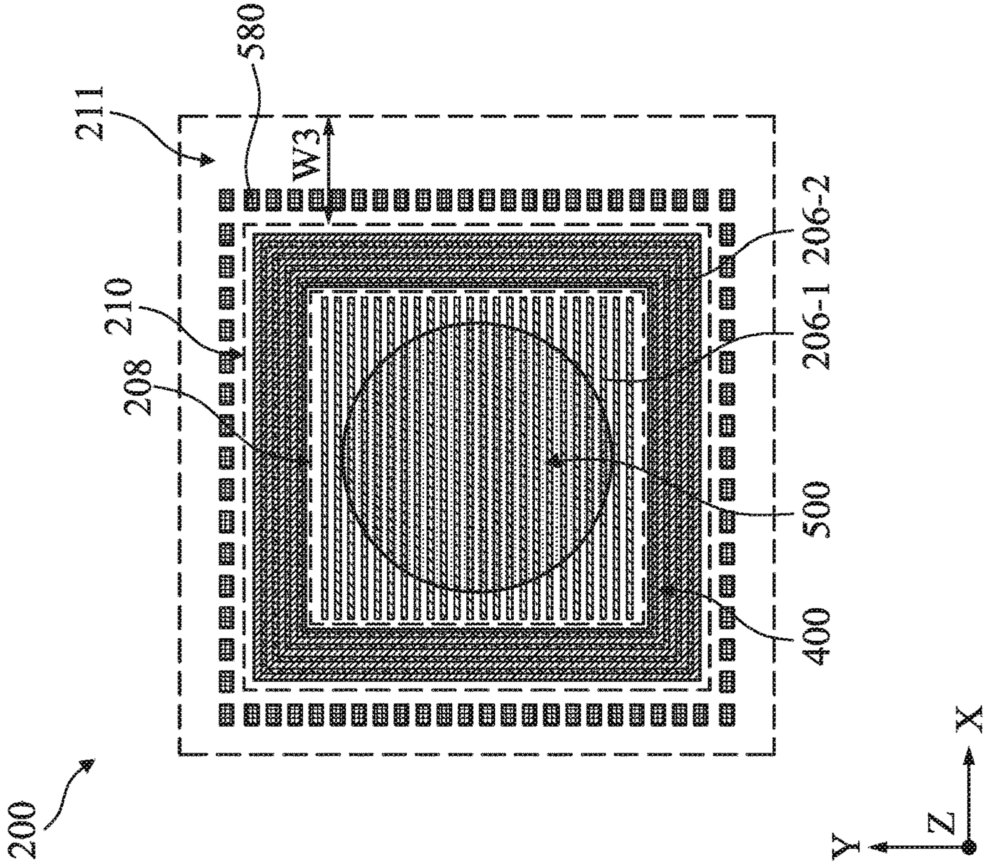
Figure 18B:
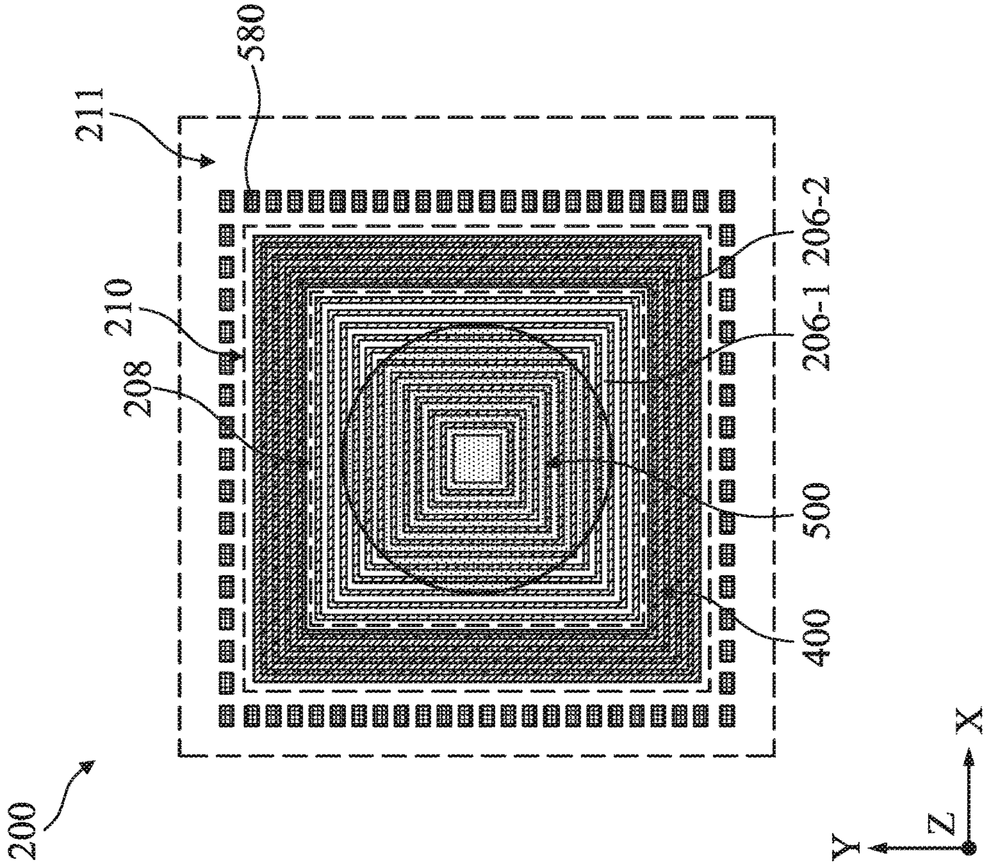
Figure 18D:
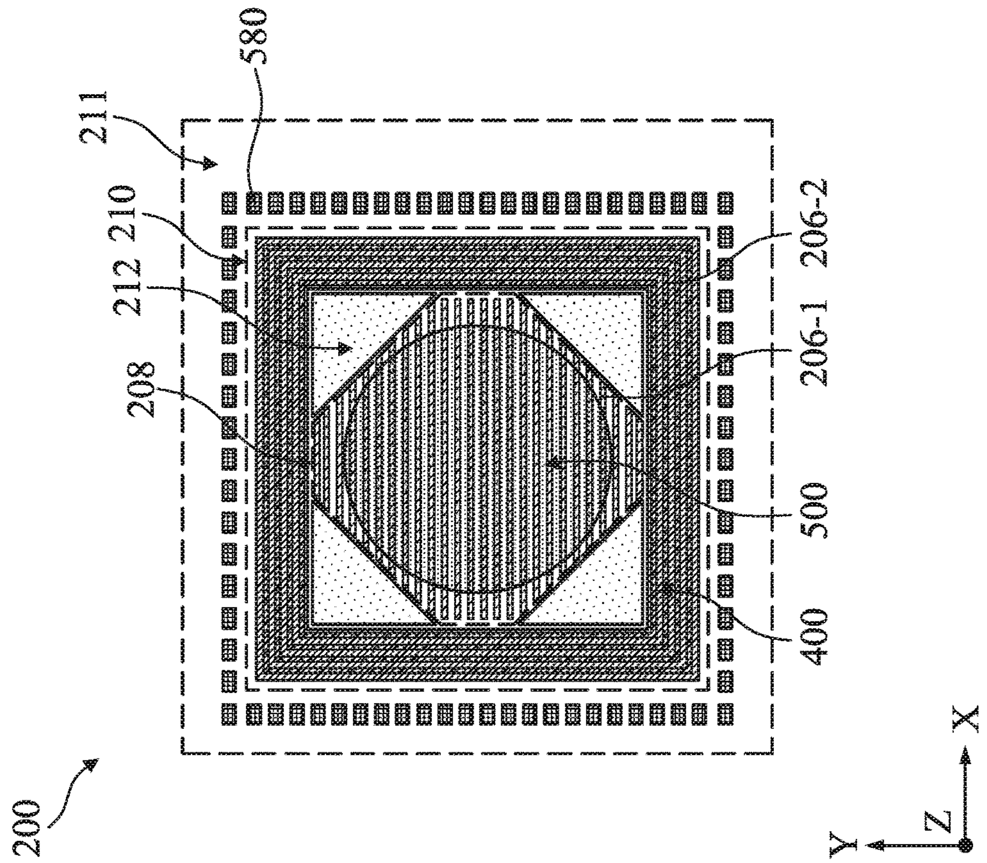
Figure 18C:
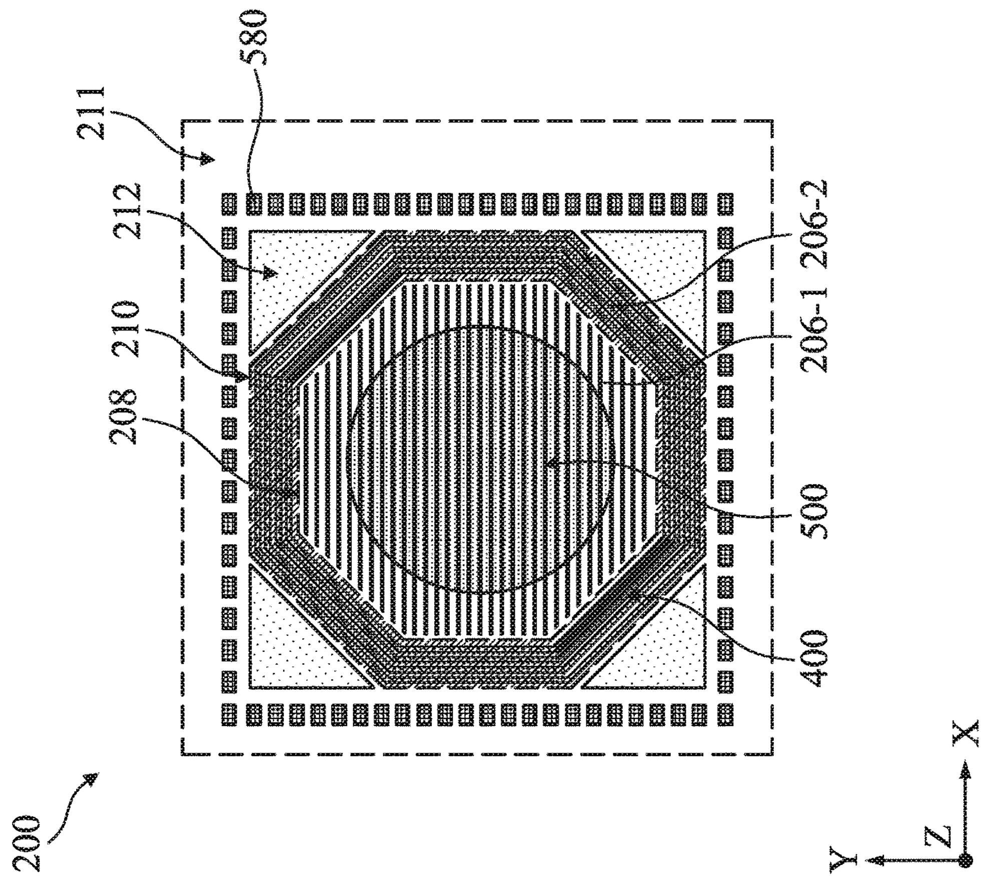

Another feature in common in FIGS. 18A-18D is that the TSV 500 extending through the active regions formed in the TSV region 208 and the guard ring 400 landing on the moat-like active regions formed in the guard ring region 210. In the depicted embodiments, the active regions formed in the TSV region 208 are fin-like active regions, such as the fins 206-1, and the moat-like active regions formed in the guard ring region 210 are fin-like active regions, such as the fins 206-2. In FIGS. 18A, 18C, and 18D, the fins 206-1 extends lengthwise in the X direction. In FIG. 18B, the fins 206-1 are also formed as a moat-like structure, similar to the fins 206-2. In FIGS. 18A and 18B, the TSV region 208 has a square or rectangular shape, and the guard ring region 210 is a square or rectangular ring. In FIG. 18C, the TSV region 208 has an octagon shape, and the guard ring region 210 is an octagon ring. Four corner regions 212 are located between the guard ring region 210 and the transition region 211. Corner stress relief (CSR) features are formed in the corner regions 212 to further release stress. The corner regions 212 are also referred to as CSR regions 212. In FIG. 18D, the TSV region 208 has an octagon shape, and the guard ring region 210 is a square or rectangular ring. Four CSR regions 212 with CSR features are located at the four corners between the TSV region 208 and the guard ring region 210. To be noticed, like in FIGS. 18A, 18C, and 18D, not all the fins 206-1 in the TSV region 208 are divided by the TSV 500 into two segments, a portion of the fins 206 at edges of the TSV region 208 may remain intact.

Figure 19:
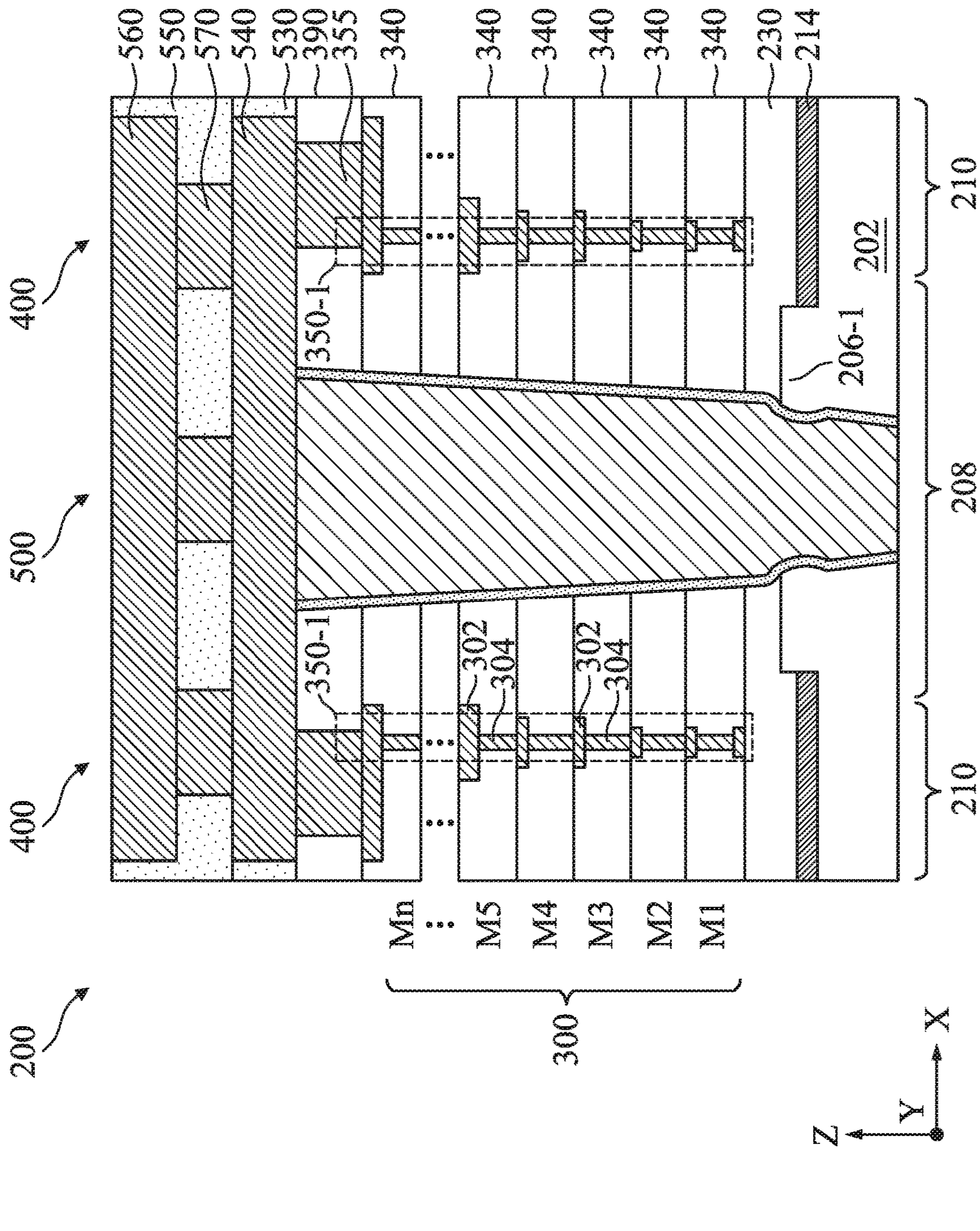
Figure 20:
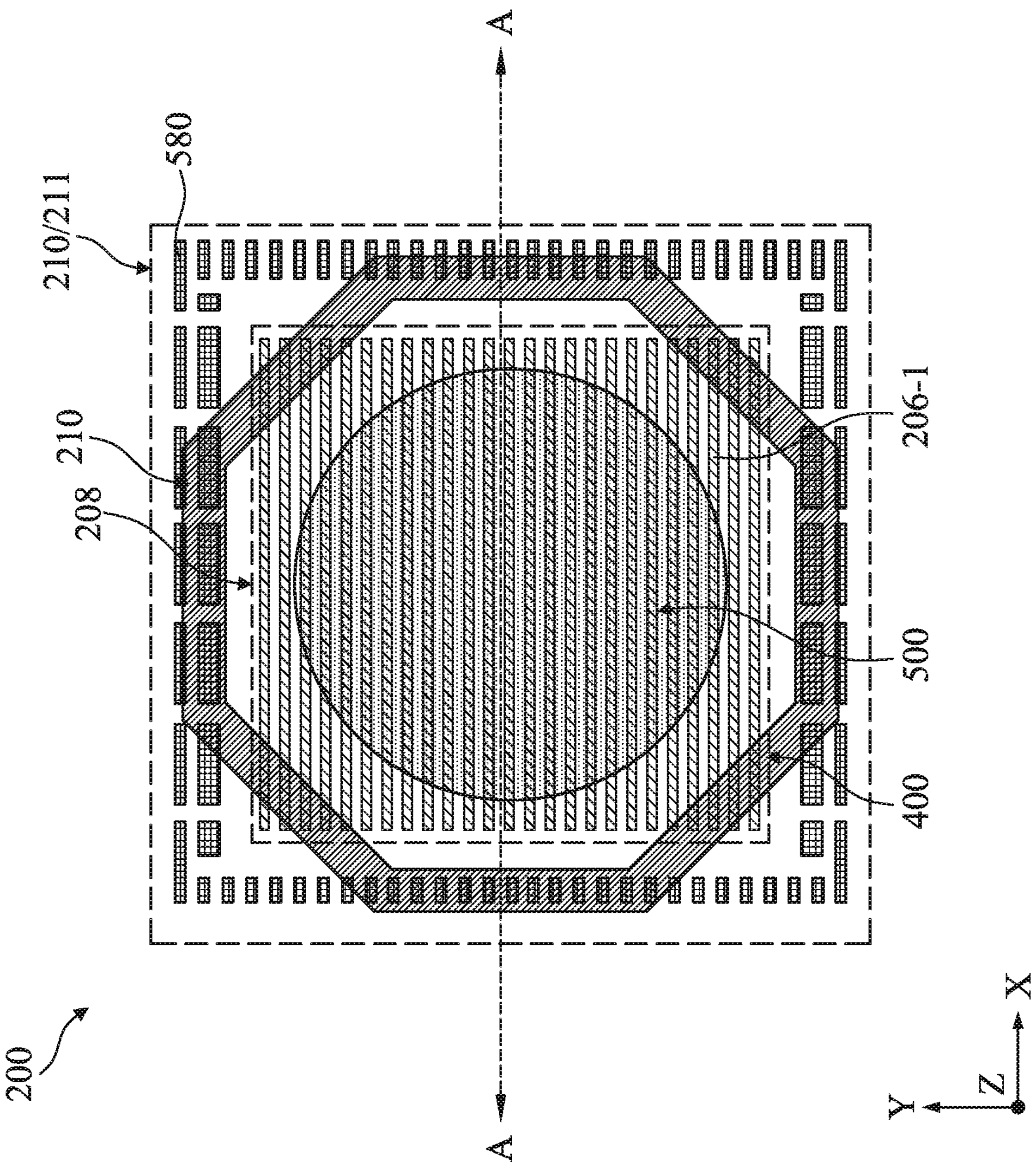

Reference is now made to FIGS. 19 and 20 collectively, which illustrate a fragmental cross-sectional view and a see-through top view of an alternative embodiment of the workpiece 200. Particularly, FIG. 19 is a fragmentary cross-sectional view of the workpiece 200 along a A-A cutline in FIG. 20. It is noted that, for simplicity of illustration, FIG. 20 does not include illustration of every single layer. For example, it is the TSV 500, the top metal line 302 in the top metallization layer Mn of the guard ring 400, the fins 206-1 that the TSV 500 extends through, and dummy inserts 580 formed in the transition region 211 are depicted, while other features may just be omitted. As shown in FIG. 19, in the alternative embodiment, the active regions (e.g., fins 206-1) are formed in the TSV region 208, but not in the guard ring region 210. State differently, the guard ring region 210 is cleared of FEOL and MEOL features. Accordingly, the bottom of the guard ring region 210 is not landing on any FEOL and/or MEOL features, but starts from the first metallization layer M1. The guard ring region 210 may include a single metal sidewall 350-1. Alternatively, the guard ring region 210 may still include double metal sidewalls 350-1 and 350-2 as depicted in FIG. 17.

Still referring to FIG. 19, a metal coupling feature 355 is formed over the guard ring 400. The metal coupling feature 355 is formed in the additional IMD layer 390 to physically and electrically coupled to the top surface of the guard ring 400. According to the present disclosure, the metal coupling feature functions to electrically couple the guard ring 400 and the TSV 500 through the first top metal feature 540 to spread stress and reduce stray or parasitic capacitance. That is, the metal coupling feature 355 of the present disclosure may only need to provide vertical connection. For that reason, the metal coupling feature 355 does not need to have a lower via portion and an upper metal line portion and may only need a single level, which may resemble either a via or a metal line in some embodiments. In the depicted embodiment, the metal coupling feature 355 is a moat-like structure, just like the metal sidewall 350-1. A width of the metal coupling feature 355 may be narrower than that of the top metal line 302 in the top metallization layer Mn but larger than that of the metal sidewall 350-1. The metal coupling feature 355 may be formed using a single damascene process and may include titanium (Ti), ruthenium (Ru), nickel (Ni), cobalt (Co), copper (Cu), molybdenum (Mo), tungsten (W), aluminum (Al), and/or other suitable materials. In one embodiment, the metal coupling feature 355 may include copper (Cu).

As shown in FIG. 20, the active regions are all located inside the TSV region 208 as the fins 206-1, such that the guard ring region 210 is cleared of fins. In the depicted embodiment as in FIG. 20, the TSV region 208 has a square or rectangular shape, and the guard ring 400 is an octagonal ring. A portion of the guard ring 400 travels across four corners of the TSV region 208 and overhangs above some of the fins 206-1. There is also not a clear boundary between the guard ring region 210 and the transition region 211, such that some dummy inserts 580 are under the guard ring 400. For example, the guard ring 400 may have a single metal sidewall 350-1 (as depicted FIG. 19), and some dummy inserts 580 are inserted under the guard ring 400 at locations where the outer metal sidewall 350-2 would otherwise reside. Such a configuration helps reducing the footprint of the TSV with guard ring structure. The smaller footprint is helpful to reduce the size of KOZ to spare more area for device regions to accommodate more functional devices.

Although not intended to be limiting, one or more embodiments of the present disclosure provide many benefits to a semiconductor device and the formation thereof. In some depicted embodiments, the guard ring 400 is substantially cylindrical with an axis extending along the Z direction. The guard ring 400 completely surrounds the TSV 500 on the X-Y plane. The TSV 500 contacts and extends through the FEOL features formed on the workpiece 200 to better spread stress into the substrate 202. Such a configuration also helps improving planarization (e.g., CMP) topography to mitigate device off-target drifting and metal line cracking. The guard ring 400 may physically and electrically connects with FEOL and/or MEOL features formed on the workpiece 200 to be biased to ground. The grounded guard ring 400 improves PID protection and shields the TSV 500 from interfering functional devices outside of the guard ring 400. Alternatively, the guard ring 400 may electrically connect to the TSV 500 through top metal features to better spread stress and further reduce stray or parasitic capacitance. In furtherance of some embodiments, CSR regions are provided inside or outside of the guard ring 400 to further reduce stress at corner regions of the TSV structure.

In one exemplary aspect, the present disclosure is directed to a method. The method includes forming active regions on a substrate, forming an interconnect structure over the active regions, the interconnect structure including a plurality of dielectric layers and a guard ring disposed within the dielectric layers, etching an opening through the interconnect structure and at least a first portion of the active regions, the opening extending into the substrate, and forming a via structure within the opening, the via structure being surrounded by the guard ring when viewed along a direction perpendicular to a top surface of the substrate. In some embodiments, the active regions are fin-like active regions. In some embodiments, the fin-like active regions including a crystalline semiconductor material protruding continuously from the substrate. In some embodiments, the fin-like active regions include an epitaxial stack of first semiconductor layers and second semiconductor layers interposed one over another, the first and second semiconductor layers including different material compositions. In some embodiments, the via structure is in contact with each of the first portion of the active regions. In some embodiments, the guard ring overhangs and is in electrical connection with a second portion of the active regions. In some embodiments, the method further includes forming contact plugs on the second portion of the active regions, the guard ring being in contact with the contact plugs. In some embodiments, the method further includes depositing a top dielectric layer over the via structure and the guard ring, and forming a top metal feature in the top dielectric layer such that the top metal feature spans over and contacts the via structure and the guard ring. In some embodiments, the guard ring includes metal features disposed in each of the dielectric layers of the interconnect structure. In some embodiments, after the forming of the via structure, remaining parts of the first portion of the active regions extend out of a sidewall of the via structure for a distance of at least 0.1 um.

In another exemplary aspect, the present disclosure is directed to a method of forming a semiconductor device. The method includes forming a plurality of first fins on a substrate, forming a plurality of second fins on the substrate, the second fins circling the first fins in a top view of the semiconductor device, forming contact plugs on the second fins, depositing an interconnect structure over the substrate, the interconnect structure including a guard ring extending upward from the contact plugs, etching the interconnect structure to form an opening, extending the opening through the first fins and into the substrate, and depositing a via structure in the opening, the guard ring circling the via structure in the top view. In some embodiments, the method further includes thinning a backside of the substrate to expose the via structure. In some embodiments, sidewalls of the via structure are in contact with the first fins. In some embodiments, the guard ring is electrically isolated from the via structure. In some embodiments, the method further includes forming a corner stress relief (CSR) region between the via structure and the guard ring. In some embodiments, the contact plugs include source/drain contact plugs and gate contact plugs, and the guard ring includes a first sidewall landing on the source/drain contact plugs and a second sidewall landing on the gate contact plugs. In some embodiments, the second sidewall has a height less than the first sidewall.

In yet another exemplary aspect, the present disclosure is directed to a semiconductor structure. The semiconductor structure includes a substrate, a plurality of fins protruding from the substrate, an interconnect structure over the plurality of fins, a guard ring structure disposed in the interconnect structure, a via structure vertically extending through a region surrounded by the guard ring structure and through the plurality of fins and the substrate, and a barrier layer disposed on sidewalls of the via structure and electrically isolating the via structure from the substrate. In some embodiments, the semiconductor structure further includes a top metal feature disposed over and in contact with the guard ring structure and the via structure. In some embodiments, the guard ring structure is in electrical connection with the substrate, and the guard ring structure is electrically isolated from the via structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

forming active regions on a substrate;

forming an interconnect structure over the active regions, the interconnect structure including a plurality of dielectric layers and a guard ring disposed within the dielectric layers;

after the forming of the interconnect structure that includes the dielectric layers and the guard ring, etching an opening through the interconnect structure and at least a first portion of the active regions, the opening extending into the substrate; and forming a via structure within the opening, the via structure being surrounded by the guard ring when viewed along a direction perpendicular to a top surface of the substrate.

2. The method of claim 1, wherein the active regions are fin-like active regions.

3. The method of claim 2, wherein the fin-like active regions including a crystalline semiconductor material protruding continuously from the substrate.

4. The method of claim 2, wherein the fin-like active regions include an epitaxial stack of first semiconductor layers and second semiconductor layers interposed one over another, the first and second semiconductor layers including different material compositions.

5. The method of claim 1, wherein the via structure is in contact with each of the first portion of the active regions.

6. The method of claim 1, wherein the guard ring overhangs and is in electrical connection with a second portion of the active regions.

7. The method of claim 6, further comprising:

forming contact plugs on the second portion of the active regions, wherein the guard ring is in contact with the contact plugs.

8. The method of claim 1, further comprising:

depositing a top dielectric layer over the via structure and the guard ring; and forming a top metal feature in the top dielectric layer such that the top metal feature spans over the via structure and the guard ring, wherein the top metal feature interfaces with a top surface of the via structure.

9. The method of claim 1, wherein the guard ring includes metal features disposed in each of the dielectric layers of the interconnect structure.

10. The method of claim 1, wherein after the forming of the via structure, remaining parts of the first portion of the active regions extend out of a sidewall of the via structure for a distance of at least 0.1 μm.

11. A method of forming a semiconductor device, comprising:

forming a plurality of first fins on a substrate;

forming a plurality of second fins on the substrate, wherein the second fins circle the first fins in a top view of the semiconductor device;

forming contact plugs on the second fins;

depositing an interconnect structure over the substrate, wherein the interconnect structure includes a guard ring extending upward from the contact plugs;

etching the interconnect structure to form an opening;

extending the opening through the first fins and into the substrate; and depositing a via structure in the opening, wherein the guard ring circles the via structure in the top view.

12. The method of claim 11, further comprising:

thinning a backside of the substrate to expose the via structure.

13. The method of claim 11, wherein sidewalls of the via structure are in contact with the first fins.

14. The method of claim 11, wherein the guard ring is electrically isolated from the via structure.

15. The method of claim 11, further comprising:

forming a corner stress relief (CSR) region between the via structure and the guard ring.

16. The method of claim 11, wherein the contact plugs include source/drain contact plugs and gate contact plugs, and wherein the guard ring includes a first sidewall landing on the source/drain contact plugs and a second sidewall landing on the gate contact plugs.

17. The method of claim 16, wherein the second sidewall has a height less than the first sidewall.

18. A method, comprising:

forming a plurality of first fin-shaped structures and a plurality of second fin-shaped structures protruding from a substrate;

forming an interconnect structure over the first and second fin-shaped structures, the interconnect structure including a plurality of dielectric layers and a guard ring disposed within the dielectric layers and positioned directly above the second fin-shaped structures;

etching an opening through the interconnect structure and the first fin-shaped structures, the opening extending into the substrate, the opening dividing the first fin-shaped structures into segments;

forming a via structure within the opening, the via structure being surrounded by the guard ring when viewed from top; and thinning the substrate from a backside of the substrate to expose the via structure.

19. The method of claim 18, further comprising:

forming contacts over the second fin-shaped structures, wherein the contacts electrically connect the guard ring to the second fin-shaped structures.

20. The method of claim 18, wherein when viewed from top the first fin-shaped structures are circled by the second fin-shaped structures.

* * * * *